(12) United States Patent
Sugiyama et al.

(10) Patent No.: US 10,187,048 B2
(45) Date of Patent: Jan. 22, 2019

(54) COMPARATOR CIRCUIT, A/D CONVERSION CIRCUIT, AND DISPLAY APPARATUS

(71) Applicant: SONY CORPORATION, Tokyo (JP)

(72) Inventors: Takaaki Sugiyama, Kanagawa (JP); Masaki Yoshioka, Kanagawa (JP); Ken Kikuchi, Tokyo (JP); Masaru Chibashi, Kanagawa (JP); Ken Kitamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 120 days.

(21) Appl. No.: 14/895,164

(22) PCT Filed: May 28, 2014

(86) PCT No.: PCT/JP2014/064087
§ 371 (c)(1),
(2) Date: Dec. 1, 2015

(87) PCT Pub. No.: WO2014/199826
PCT Pub. Date: Dec. 18, 2014

(65) Prior Publication Data
US 2016/0118971 A1 Apr. 28, 2016

(30) Foreign Application Priority Data
Jun. 12, 2013 (JP) .................. 2013-123453

(51) Int. Cl.
*H03K 5/24* (2006.01)
*H03K 5/08* (2006.01)
(Continued)

(52) U.S. Cl.
CPC ......... *H03K 5/2481* (2013.01); *G09G 3/2014* (2013.01); *G09G 3/2018* (2013.01);
(Continued)

(58) Field of Classification Search
CPC ........ H03K 5/2481; H03K 5/08; H03K 5/249; G09G 3/2014; G09G 3/2018;
(Continued)

(56) References Cited

U.S. PATENT DOCUMENTS

2005/0156828 A1 7/2005 Yamashita et al.
2012/0113161 A1 5/2012 Hong et al.

FOREIGN PATENT DOCUMENTS

CN 1397058 A 2/2003
CN 1698084 A 11/2005
(Continued)

OTHER PUBLICATIONS

Office Action for JP Patent Application No. 2013-123453, dated Mar. 21, 2017, 05 pages.
(Continued)

*Primary Examiner* — Nicholas Lee
*Assistant Examiner* — Ngan T Pham Lu
(74) *Attorney, Agent, or Firm* — Chip Law Group

(57) ABSTRACT

A comparator circuit according to the present disclosure includes: a first switch section that selectively takes in a signal voltage; a second switch section that selectively takes in a control waveform; a differential amplifier including a non-inverted input end connected to each of output ends of the first switch section and the second switch section; a capacity section including one end connected to an inverted input end of the differential amplifier and the other end supplied with a reference voltage; and a third switch section that selectively short-circuits the inverted input end and an output end of the differential amplifier.

5 Claims, 12 Drawing Sheets

(51) Int. Cl.
*G09G 3/20* (2006.01)
*G09G 3/32* (2016.01)
*H03M 1/34* (2006.01)
*H03M 1/12* (2006.01)
*H03M 1/50* (2006.01)
*H03M 1/56* (2006.01)

(52) U.S. Cl.
CPC ............ *G09G 3/2074* (2013.01); *G09G 3/32* (2013.01); *H03K 5/08* (2013.01); *H03K 5/249* (2013.01); *H03M 1/34* (2013.01); *G09G 2300/0426* (2013.01); *G09G 2300/0439* (2013.01); *G09G 2300/0819* (2013.01); *G09G 2310/0291* (2013.01); *G09G 2310/06* (2013.01); *G09G 2320/0233* (2013.01); *G09G 2320/064* (2013.01); *G09G 2330/021* (2013.01); *H03M 1/123* (2013.01); *H03M 1/504* (2013.01); *H03M 1/56* (2013.01)

(58) Field of Classification Search
CPC ............... G09G 3/2074; G09G 3/32; G09G 2300/0426; G09G 2300/0439; G09G 2300/0819; G09G 2310/0291; G09G 2310/06; G09G 2320/0233; G09G 2320/064; G09G 2330/021; H03M 1/34; H03M 1/123; H03M 1/504; H03M 1/56

USPC ......................................................... 345/691
See application file for complete search history.

(56) References Cited

FOREIGN PATENT DOCUMENTS

| JP | 55-061136 A | | 5/1980 |
|----|----|----|----|
| JP | 56-120220 | | 9/1981 |
| JP | 56-120220 A | | 9/1981 |
| JP | 05-206756 | * | 8/1993 |
| JP | 05-206756 A | | 8/1993 |
| JP | 05-240887 A | | 9/1993 |
| JP | 06-013659 A | | 1/1994 |
| JP | 2004-510208 | | 4/2004 |
| JP | 2004-510208 A | | 4/2004 |
| JP | 2004510208 A | | 4/2004 |

OTHER PUBLICATIONS

Office Action for JP Patent Application No. 2013-123453, dated Oct. 17, 2017, 03 pages of Office Action and 03 pages of English Translation.

Office Action for CN Patent Application No. 201480032161.7, dated Nov. 28, 2017, 12 pages of Office Action and 16 pages of English Translation.

* cited by examiner

COMPARATOR CIRCUIT, A/D CONVERSION CIRCUIT, AND DISPLAY APPARATUS

TECHNICAL FIELD

The present disclosure relates to a comparator circuit, an A/D conversion circuit, and a display apparatus.

BACKGROUND ART

As a comparator circuit, a chopper comparator circuit using an inverter circuit is known (e.g., see Patent Document 1). The conventional chopper comparator circuit using the inverter circuit includes first and second switch sections, a capacity section connected between output ends of the two switch sections and an input end of the inverter circuit, and a third switch section that selectively short-circuits the input/output ends of the inverter circuit.

Patent Document 1: Japanese Patent Application Laid-open No. HEI 05-240887

SUMMARY OF INVENTION

Problem to be Solved by the Invention

Regarding the chopper comparator circuit according to the above-mentioned conventional example, for example, a power-supply (power-supply potential, ground potential) fluctuates if a large current flows due to an operation or the like of a circuit section at the subsequent stage. In this case, the power-supply fluctuation changes the logical threshold. If the logical threshold of the chopper comparator circuit changes, the comparator circuit cannot accurately perform a comparison operation.

In view of this, it is an object of the present disclosure to provide a comparator circuit capable of reducing the influence of the power-supply fluctuation and the like and accurately perform the comparison operation and A/D conversion circuit and display apparatus using the comparator circuit.

Means for Solving the Problem

A comparator circuit according to a first aspect of the present disclosure for achieving the above-mentioned object includes:

a first switch section that selectively takes in a signal voltage;

a second switch section that selectively takes in a control waveform;

a capacity section including one end connected to each of output ends of the first switch section and the second switch section;

a differential amplifier including an inverted input end connected to the other end of the capacity section and a non-inverted input end supplied with a reference voltage; and a third switch section that selectively short-circuits the inverted input end and an output end of the differential amplifier.

A comparator circuit according to a second aspect of the present disclosure for achieving the above-mentioned object includes:

a first switch section that selectively takes in a signal voltage;

a second switch section that selectively takes in a control waveform;

a differential amplifier including a non-inverted input end connected to each of output ends of the first switch section and the second switch section;

a capacity section including one end connected to an inverted input end of the differential amplifier and the other end supplied with a reference voltage; and a third switch section that selectively short-circuits the inverted input end and an output end of the differential amplifier.

A display apparatus according to the first aspect of the present disclosure for achieving the above-mentioned object is configured such that a plurality of pixels each constituted of a light-emitting section and a drive circuit that drives the light-emitting section are arranged in a two-dimensional matrix form, the drive circuit including a comparator circuit that compares a signal voltage with a control waveform, and a driving transistor that drives the light-emitting section according to an output of the comparator circuit, the comparator circuit including a first switch section that selectively takes in a signal voltage, a second switch section that selectively takes in a control waveform, a capacity section including one end connected to each of output ends of the first switch section and the second switch section, a differential amplifier including an inverted input end connected to the other end of the capacity section and a non-inverted input end supplied with a reference voltage, and a third switch section that selectively short-circuits the inverted input end and an output end of the differential amplifier.

A display apparatus according to the second aspect of the present disclosure for achieving the above-mentioned object is configured such that a plurality of pixels each constituted of a light-emitting section and a drive circuit that drives the light-emitting section are arranged in a two-dimensional matrix form, the drive circuit including a comparator circuit that compares a signal voltage with a control waveform, and a driving transistor that drives the light-emitting section according to an output of the comparator circuit, the comparator circuit including a first switch section that selectively takes in a signal voltage, a second switch section that selectively takes in a control waveform, a differential amplifier including a non-inverted input end connected to each of output ends of the first switch section and the second switch section, a capacity section including one end connected to an inverted input end of the differential amplifier and the other end supplied with a reference voltage, and a third switch section that selectively short-circuits the inverted input end and an output end of the differential amplifier.

Effect of the Invention

According to the present disclosure, by employing the comparator circuit configuration using the differential amplifier, a malfunction, for example, a change of a logical threshold due to the power-supply fluctuation or the like does not occurs, and hence it is possible to reduce the influence of the power-supply fluctuation and the like and accurately perform the comparison operation.

Note that the effects described in the present specification are merely examples, and it is not limited thereto and additional effects may be provided.

MODE(S) FOR CARRYING OUT THE INVENTION

Figure 1:
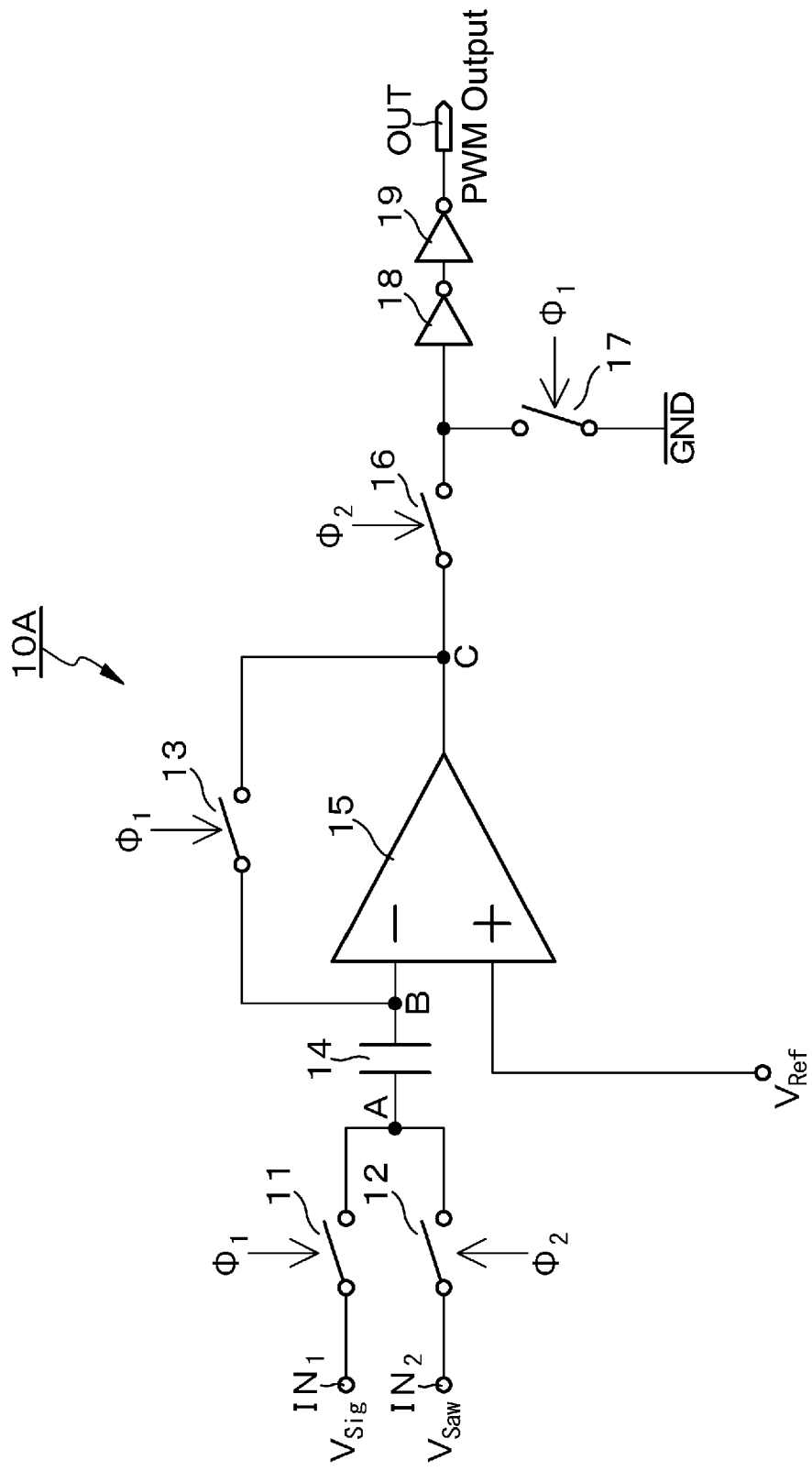
FIG. 1 is a circuit diagram showing a configuration of a comparator circuit according to Embodiment 1 (first aspect) of the present disclosure.

Hereinafter, modes for carrying out the technology of the present disclosure will be described in detail with reference to the drawings. The present disclosure is not limited to embodiments and various numerical values and the like in the embodiments are exemplary. Note that the descriptions will be made in the following orders.
1. Explanation of Comparator Circuit and Display Apparatus in General According to First Aspect and Second Aspect
2. Embodiment 1 (Comparator Circuit According to First Aspect)
3. Embodiment 2 (Comparator Circuit According to Second Aspect)
4. Embodiment 3 (Example Used in Pixel of Display Apparatus)
5. Embodiment 4 (Example Used in A/D Conversion Circuit Of Solid-State Image Pickup Device)
[Explanation of Comparator Circuit and Display Apparatus in General According to First Aspect and Second Aspect]

Hereinafter, a comparator circuit according to a first aspect of the present disclosure and a display apparatus according to the first aspect of the present disclosure will be collectively and simply referred to as the "first aspect of the present disclosure" in some cases. Similarly, hereinafter, a comparator circuit according to a second aspect of the present disclosure and a display apparatus according to the second aspect of the present disclosure will be collectively and simply referred to as the "second aspect of the present disclosure" in some cases.

Regarding the comparator circuit according to the first aspect or the comparator circuit according to the second aspect, a configuration in which it is used as that comparator circuit in an A/D conversion circuit whose input stage is provided with a comparator circuit can be made. The A/D conversion circuit using the comparator circuit according to the first aspect or the comparator circuit according to the second aspect can be used as, for example, an A/D conversion circuit in a solid-state image pickup device of a column parallel A/D conversion system.

In the first aspect of the present disclosure and the second aspect of the present disclosure, the reference voltage can be a fixed voltage. Furthermore, the control waveform can have a voltage variation of sawtooth waveform.

In the first aspect of the present disclosure and the second aspect of the present disclosure having the above-mentioned favorable configurations and forms, a configuration in which the first switch section and the third switch section are driven by switch control pulses having the same phase and the second switch section is driven by a switch control pulse having a phase opposite to that of the first switch section and the third switch section can be made.

In the first aspect of the present disclosure and the second aspect of the present disclosure having the above-mentioned favorable configurations and forms, a configuration in which a current supply section that is connected to an output end of a differential amplifier and supplies a current according to an output of the differential amplifier is provided can be made. At this time, a configuration in which the reference voltage is supplied independently from a power-supply section and a ground section corresponding to the current supply section.

In the display apparatus according to the first aspect of the present disclosure and the display apparatus according to the second aspect of the present disclosure having the above-mentioned favorable configurations and forms, a plurality of pixels are arranged in a two-dimensional matrix in a first direction and a second direction. In this pixel arrangement, a pixel group arranged along the first direction will be referred to as a "column direction pixel group" in some cases and a pixel group arranged along the second direction will be referred to as a "row direction pixel group" in some cases. If the first direction is set as a vertical direction in the display apparatus and the second direction is set as a horizontal direction in the display apparatus, the column direction pixel group means a pixel group in the vertical direction and the row direction pixel group means a pixel group arranged in the horizontal direction.

In the display apparatus according to the first aspect of the present disclosure and the display apparatus according to the second aspect of the present disclosure having the above-mentioned favorable configurations and forms, a configuration in which the plurality of pixels are arranged in a two-dimensional matrix form in the first direction and the second direction and the pixel group is divided into a P-number of pixel blocks along the first direction can be made. A form in which the light-emitting sections from light-emitting sections constituting pixels belonging to a first pixel block to light-emitting sections constituting pixels belonging to a Pth pixel block are caused to sequentially emit light for each pixel block at the same time and, when the light-emitting sections constituting the pixels belonging to some pixel blocks are caused to emit light, the light-emitting sections constituting the pixels belonging to the remaining pixel blocks are prevented from emitting light can be made.

In the display apparatus according to the first aspect of the present disclosure and the display apparatus according to the second aspect of the present disclosure having the above-mentioned favorable configurations and forms, a form in which the light-emitting section emits light a plurality of times based on a plurality of control pulses can be made. In this case, time intervals of the plurality of control pulses are favorably constant.

Furthermore, in the display apparatus according to the first aspect of the present disclosure and the display apparatus according to the second aspect of the present disclosure having the above-mentioned favorable configurations and forms, a form in which the number of control waveforms supplied to a drive circuit in one display frame is smaller than the number of control pulses in the one display frame can be made. This form can be achieved in the following manner. Specifically, a sequence of control waveforms is generated in the one display frame. Then, when light-emitting sections constituting pixels belonging to one pixel block are prevented from emitting light, a part of the sequence of control waveforms is masked and drive circuits constituting the pixels belonging to the one pixel block are not supplied with the control waveforms.

In addition, in the display apparatus according to the first aspect of the present disclosure and the display apparatus according to the second aspect of the present disclosure having the various favorable configurations and forms described above, a configuration in which the plurality of pixels are formed on a semiconductor can be made.

In addition, in the display apparatus according to the first aspect of the present disclosure and the display apparatus according to the second aspect of the present disclosure having the various favorable configurations and forms described above, a form in which the light-emitting section is constituted of a light-emitting diode (LED) can be made. The light-emitting diode can be a light-emitting diode having well known configuration and structure. That is, it is only necessary to select a light-emitting diode that has optimal configuration and structure and is formed of a suitable material depending on a light emitting color of the light-emitting diode. In the display apparatus using light-emitting diodes as the light-emitting sections, a light-emitting section formed of a red light-emitting diode functions as a red light-emitting sub-pixel, a light-emitting section formed of a green light-emitting diode functions as a green light-emitting sub-pixel, and a light-emitting section formed of a blue light-emitting diode functions as a blue light-emitting sub-pixel. The three types of sub-pixels constitute one pixel. A color image can be displayed by light-emitting states of the three types of sub-pixels.

Note that "the one pixel" in the present disclosure corresponds to "the one sub-pixel" in such a display apparatus, and hence it is only necessary to interpret "the one sub-pixel" in such a display apparatus as "the one pixel." If the one pixel is constituted of the three types of sub-pixels, examples of an arrangement of the three types of sub-pixels can include a delta arrangement, a stripe arrangement, a diagonal arrangement, and a rectangle arrangement. By driving the light-emitting diodes at a constant current based on a PWM driving method, it is possible to prevent blue shift in wavelength of spectrum of the light-emitting diodes. It can also be applied to a projector using a dichroic prism. Specifically, three panels may be prepared. A first panel may be constituted of the light-emitting section formed of the red light-emitting diode. A second panel may be constituted of the light-emitting section formed of the green light-emitting diode. A third panel may be constituted of the light-emitting section formed of the blue light-emitting diode. Light beams from the three panels may be collected by, for example, the projector.

Embodiment 1

FIG. 1 is a circuit diagram showing a configuration of a comparator circuit according to Embodiment 1 (first aspect) of the present disclosure.

As shown in FIG. 1, a comparator circuit 10A according to Embodiment 1 has a chopper comparator circuit configuration in which it includes, in addition to two circuit input terminals $IN_1$, $IN_2$ and a single circuit output terminal OUT, three switch sections 11 to 13, a capacity section 14, and a differential amplifier 15.

The comparator circuit 10A further includes switch sections 16, 17 and invertors 18, 19 depending on needs. To the one circuit input terminal $IN_1$, input is a comparison target signal, for example, a signal voltage $V_{Sig}$ of a video signal. To the other circuit input terminal $IN_2$, input is a comparison reference signal, for example, a control waveform $V_{Saw}$ having a voltage variation of sawtooth waveform.

The first switch section 11 is formed of an analog switch and its input end is connected to the circuit input terminal $IN_1$. The first switch section 11 is driven on(close)/off(open) by a switch control pulse $\Phi_1$ supplied from a control unit (not shown), to thereby selectively take in the signal voltage $V_{Sig}$. A second switch section 12 is formed of an analog switch and its input end is connected to the circuit input terminal $IN_2$. The second switch section 12 is driven on/off by a switch control pulse $\Phi_2$ having a phase opposite to that of the switch control pulse $\Phi_1$ that is supplied from the control unit (not shown), to thereby selectively take in the control waveform $V_{Saw}$.

The capacity section 14 includes one end connected to each of the output ends of the switch sections 11 and 12. The differential amplifier 15 includes an inverted (−) input end connected to the other end of the capacity section 14. The differential amplifier 15 includes a non-inverted input end (+) supplied with a reference voltage $V_{Ref}$. The reference voltage $V_{Ref}$ is a voltage serving as a reference of the circuit operation of this comparator circuit 10A. The reference voltage $V_{Ref}$ is a fixed voltage that is not affected by a power-supply fluctuation (fluctuation of power-supply potential $V_{DD}$ or ground (grounding) potential GND) or the like, in other words, not changed by the power-supply fluctuation and the like.

A third switch section 13 is formed of an analog switch and connected between the inverted input end and the output end of the differential amplifier 15. The third switch section 13 is driven on/off by the same switch control pulse $\Phi_1$ as the first switch section 11, to thereby selectively short-circuit the inverted input end and the output end of the differential amplifier 15. A fourth switch section 16 is formed of an analog switch and connected between the output end of the differential amplifier 15 and the input end of an invertor 18. The fourth switch section 16 is driven on/off by the same switch control pulse $\Phi_2$ as the second switch section 12, to thereby selectively short-circuit the output end of the differential amplifier 15 and the input end of the invertor 18.

The fifth switch section 17 is formed of an analog switch and connected between the input end of the invertor 18 and a predetermined potential node, for example, the ground. The fifth switch section 17 is driven on/off by the same switch control pulse $\Phi_1$ as the first switch section 11, to thereby selectively set (grounds) the input end of the invertor 18 to have a ground potential GND. The invertors 18, 19 are connected in series, to thereby derive an output having the same phase as the output of the differential amplifier 15 to the circuit output terminal OUT.

An output waveform derived to the circuit output terminal OUT becomes a waveform having a pulse width corresponding to the magnitude of the signal voltage $V_{Sig}$ (voltage value), that is, a PWM (Pulse Width Modulation) waveform. Note that, in the circuit of FIG. 1, a connection node of each of the output ends of the switch sections 11 and 12 and one end of the capacity section 14 will be referred to as a node A, a connection node of the other end of the capacity section 14 and the inverted input end of the differential amplifier 15 will be referred to as a node B, and a node of the output end of the differential amplifier 15 will be referred to as a node C.

The first to second switch sections 11 to 13 and the fourth and fifth switch sections 16, 17 can be configured to be formed of an N-channel MOS transistor, a P-channel MOS transistor, or a parallel connection of the N-channel MOS transistor and the P-channel MOS transistor.

Figure 2:
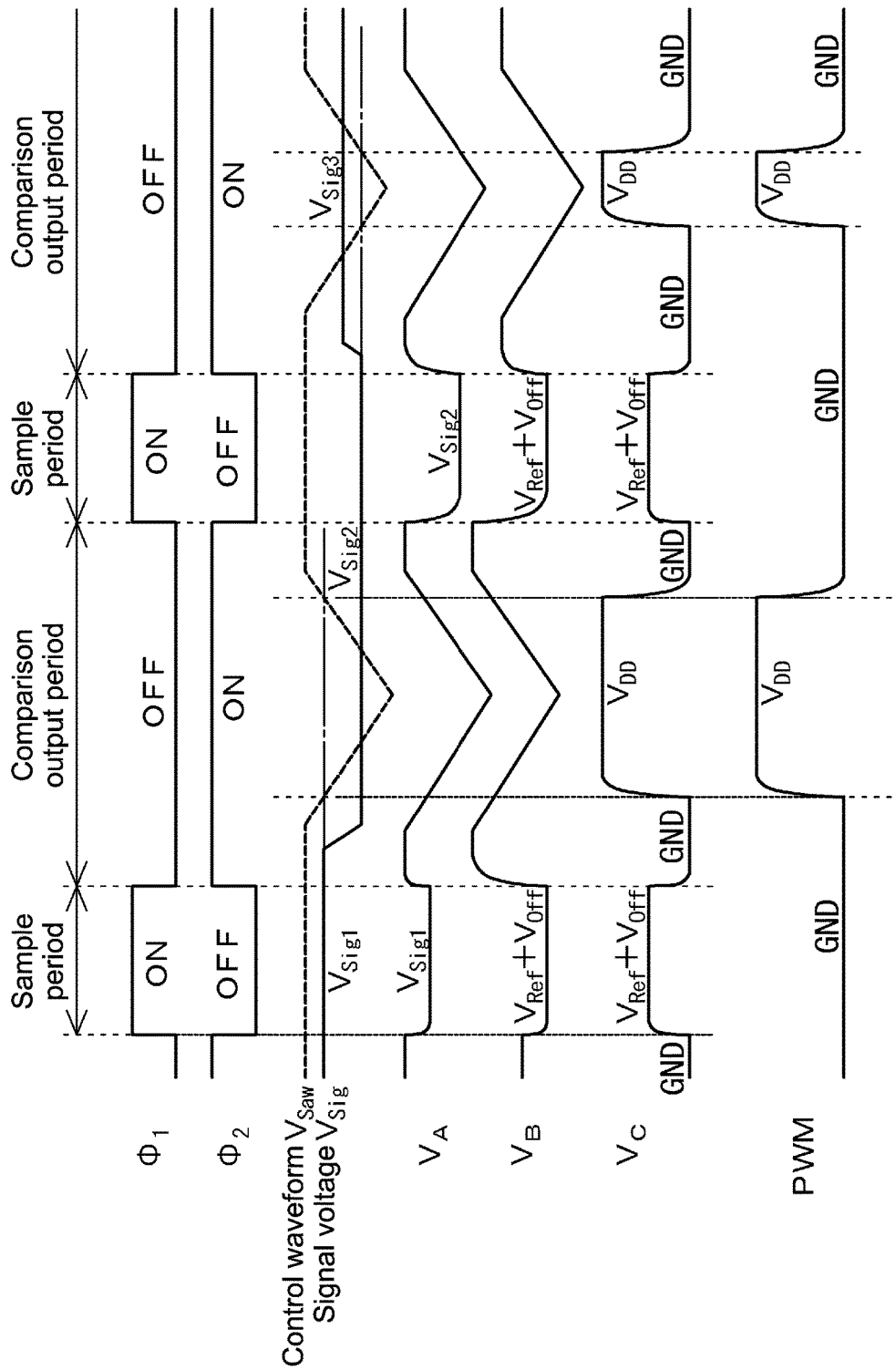
FIG. 2 is a timing waveform diagram for explaining a circuit operation of the comparator circuit according to Embodiment 1.

Next, the circuit operation of the comparator circuit 10A according to Embodiment 1 having the above-mentioned configuration will be described using a timing waveform diagram of FIG. 2. In the timing waveform diagram of FIG. 2, waveforms of the switch control pulses $\Phi_1$, $\Phi_2$, the control waveform $V_{Saw}$, the signal voltage $V_{Sig}$, a potential $V_A$ of the node A, a potential $V_B$ of the node B, a potential $V_C$ of the node C, and a PWM output are shown.

The comparator circuit 10A according to Embodiment 1 is operated in two periods of a sample period and a comparison output period. First, in the sample period, the switch control pulse $\Phi_1$ becomes active (in this example, high level) and the switch control pulse $\Phi_2$ becomes inactive (in this example, low level). With this, the first switch section 11 is turned on and takes in the signal voltage $V_{Sig}$. At the same time, the third switch section 13 is turned on and electrically short-circuits the inverted input end and the output end of the differential amplifier 15.

The inverted input end and the output end of the differential amplifier 15 are short-circuited. Thus, a negative feedback configuration is obtained. Due to the virtual ground, the potential of the non-inverted input end, the potential of the inverted input end, and the potential of the output end of the differential amplifier 15 become approximately equal. Here, assuming that a variation specific to the differential amplifier 15 is denoted by an offset voltage $V_{Off}$, the potential of the inverted input end of the differential amplifier 15, that is, the potential $V_B$ of the node B becomes $V_{Ref}+V_{Off}$ and the potential of the output end, that is, the potential $V_C$ of the node C becomes $V_{Ref}+V_{Off}$. At the same time, due to the taking-in of the signal voltage $V_{Sig}$ by the first switch section 11, the potential $V_A$ of the node A becomes the signal voltage $V_{Sig}$. With this, the capacity section 14 is charged with electrical charges equivalent to $V_{Sig}-(V_{Ref}+V_{Off})$.

Furthermore, in the sample period, the fourth switch section 16 is off and the fifth switch section 17 is on. With this, the output end of the differential amplifier 15 and the input end of the invertor 18 are electrically cut off and the input end of the invertor 18 is grounded. Thus, the PWM output derived to the circuit output terminal OUT is at a potential of the input end of the invertor 18, that is, the ground potential GND.

Next, when the comparison output period comes, the switch control pulse $\Phi_1$ becomes inactive and the switch control pulse $\Phi_2$ becomes active. With this, instead of the first switch section 11, the second switch section 12 is turned on and takes in the control waveform $V_{Saw}$. At the same time, the third switch section 13 is turned off and electrically opens a part between the inverted input end and the output end of the differential amplifier 15.

Due to the taking-in of the control waveform $V_{Saw}$ by the second switch section 12, the potential $V_A$ of the node A becomes a maximum level of the control waveform $V_{Saw}$. At this time, the potential $V_B$ of the node B becomes $V_B=V_{Saw}-\{V_{Sig}-(V_{Ref}+V_{Off})\}$. Here, in the comparison output period, the control waveform $V_{Saw}$ is a sawtooth waveform, dropping from a maximum level at a predetermined tilt angle, reaching a minimum level, and then increasing at the same tilt angle.

At an initial phase of the comparison output period, the control waveform $V_{Saw}$ is at a maximum level or a level near it, which is higher than the signal voltage $V_{Sig}$ (=signal voltage $V_{Sig1}$) written in the sample period. In this case, the potential $V_B$ of the node B is higher than the reference voltage $V_{Ref}$ of the non-inverted input end of the differential amplifier 15. Therefore, the potential of the output end of the differential amplifier 15, that is, the potential $V_C$ of the node C becomes the ground potential GND.

After that, when the control waveform $V_{Saw}$ starts to drop, the potential $V_A$ of the node A and the potential $V_B$ of the node B correspondingly drops. At a timing when the control waveform $V_{Saw}$ drops below the signal voltage $V_{Sig}$ (signal voltage $V_{Sig1}$) written in the sample period, the potential $V_B$ of the node B drops below the reference voltage $V_{Ref}$. That is, $V_B-V_{Saw}=V_{Sig}-(V_{Ref}+V_{Off})<0$ is established. With this, the potential of the output end of the differential amplifier 15, that is, the potential $V_C$ of the node C becomes the power-supply potential $V_{DD}$.

When the control waveform $V_{Saw}$ reaches the minimum level and then starts to rise, the potential $V_A$ of the node A and the potential $V_B$ of the node B correspondingly rises. At a timing when the control waveform $V_{Saw}$ rises above the signal voltage $V_{Sig1}$, the potential $V_B$ of the node B rises above the reference voltage $V_{Ref}$. That is, $V_B-V_{Saw}=V_{Sig}-(V_{Ref}+V_{Off})>0$ is established. With this, the potential of the output end of the differential amplifier 15, that is, the potential $V_C$ of the node C is inverted to become the ground potential GND.

Furthermore, in the comparison output period, the fourth switch section 16 is on and the fifth switch section 17 is off. With this, the output end of the differential amplifier 15 and the input end of the invertor 18 are electrically short-circuited. Thus, the potential of the output end of the differential amplifier 15, that is, the potential $V_C$ of the node C is inverted by the invertor 18 and further inverted by the invertor 19 and is derived as the PWM output to the circuit output terminal OUT.

The above-mentioned operations of sample period and comparison output period are alternately repeated. Thus, the comparison operation of the control waveform $V_{Saw}$ that is the sawtooth waveform as the comparison reference signal with the signal voltage $V_{Sig}$ as the comparison target signal is performed. With this comparison operation, the PWM output having the pulse width corresponding to the magnitude of the signal voltage $V_{Sig}$ ($V_{Sig1}$, $V_{Sig2}$, $V_{Sig3}$, . . . ) is output from the circuit output terminal OUT.

In the comparator circuit 10A according to Embodiment 1, by using the differential amplifier 15 instead of the inverter circuit of the conventional chopper comparator circuit, a malfunction, for example, a change of a logical threshold due to the power-supply fluctuation and the like in the case where the inverter circuit is used does not occur. Thus, it is possible to reduce the influence of the power-supply fluctuation and the like and accurately perform the comparison operation. In other words, it is possible to eliminate the accuracy error of the comparison operation.

By the way, in the comparator circuit 10A according to Embodiment 1, in the case where the third switch section 13 is constituted of, for example, an N-channel MOS transistor, the potential $V_B$ of the node B should not be equal to or larger than the withstand voltage of the MOS transistor. Furthermore, a PN diode of the MOS transistor should not be on, and hence the potential $V_B$ of the node B should not be too low. Thus, it is necessary to operate the node B at a voltage between the power-supply potential $V_{DD}$ and the ground potential GND, and hence dynamic ranges of the signal voltage $V_{Sig}$ and the control waveform $V_{Saw}$ are limited. The same applies to a case where the third switch section 13 is formed of a P-channel MOS transistor.

Furthermore, both ends of the capacity section 14 have parasitic capacitances. Therefore, for charging/discharging the capacity section 14 by the signal voltage $V_{Sig}$ and the control waveform $V_{Saw}$, the circuit that generates the signal voltage $V_{Sig}$ and the control waveform $V_{Saw}$ is needed to have a driving capability for driving the capacity section 14 having the parasitic capacitances. In addition, as clear from the above description of the operation, the potential $V_C$ of the node C is the ground potential GND in the period from the end of the sample period to the start of dropping of the control waveform $V_{Saw}$, and hence the capacity value of the capacity section 14 is changed by an off leakage current of the third switch section 13.

Embodiment 2

Hereinafter, a comparator circuit 10B according to Embodiment 2, which has been made for overcoming the above problems of the comparator circuit 10A according to Embodiment 1, will be described.

Figure 3:
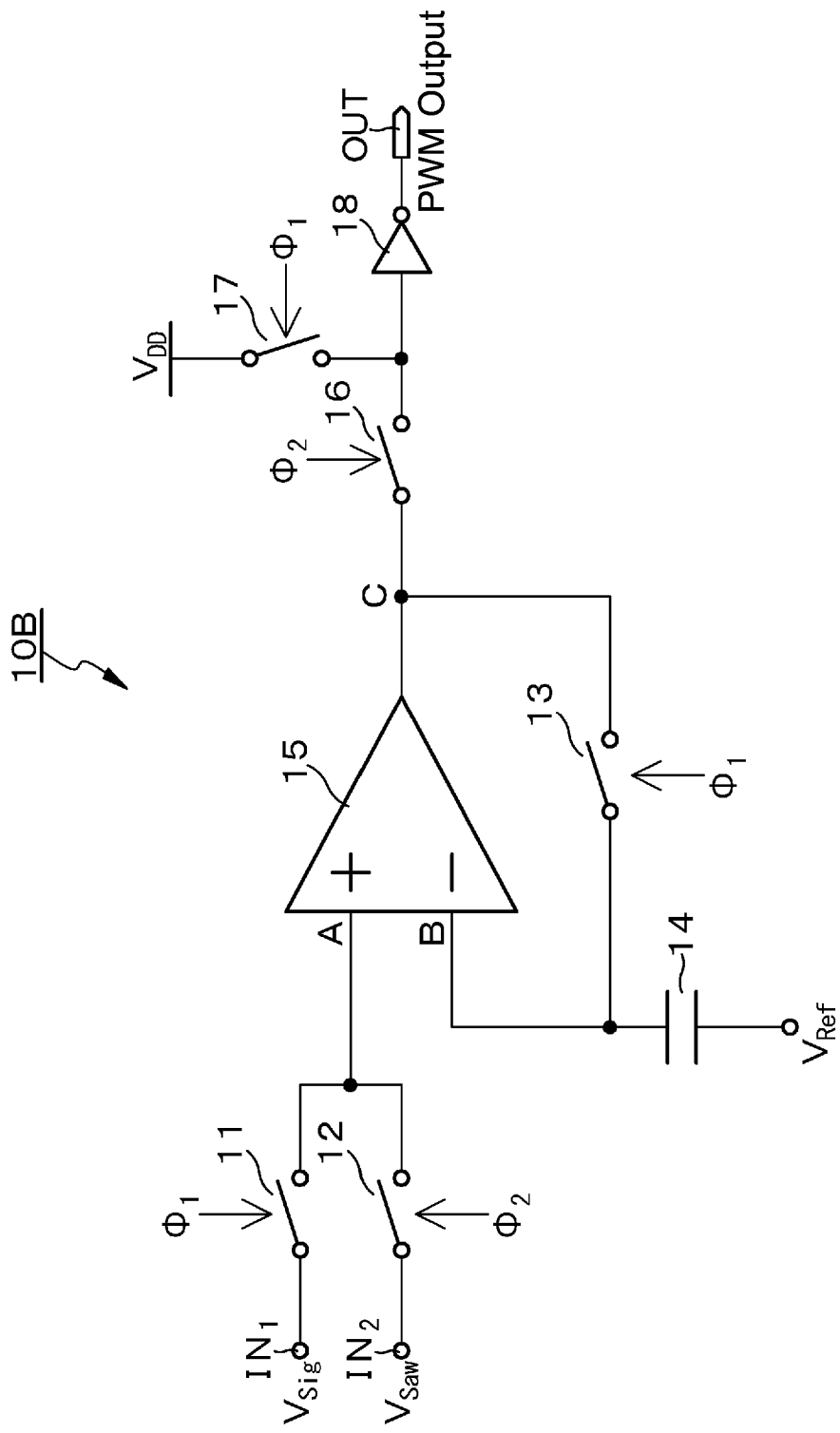
FIG. 3 is a circuit diagram showing a configuration of a comparator circuit according to Embodiment 2 (second aspect) of the present disclosure.

FIG. 3 is a circuit diagram showing a configuration of the comparator circuit according to Embodiment 2 of the present disclosure (second aspect).

As shown in FIG. 3, as in the comparator circuit 10A according to Embodiment 1, the comparator circuit 10B according to Embodiment 2 has a chopper comparator circuit configuration including three switch sections 11 to 13, a capacity section 14, and a differential amplifier 15. To one circuit input terminal $IN_1$, input is a signal voltage $V_{Sig}$ of a video signal as the comparison target signal, for example. To the other circuit input terminal $IN_2$, input is a control waveform $V_{Saw}$ having a voltage variation of sawtooth waveform as the comparison reference signal, for example. Depending on needs, the comparator circuit 10B further includes switch sections 16, 17 and an invertor 18.

The first switch section 11 is formed of an analog switch and its input end is connected to the circuit input terminal $IN_1$. The first switch section 11 is driven on/off by a switch control pulse $\Phi_1$ supplied from the control unit (not shown), to thereby selectively take in the signal voltage $V_{Sig}$. The second switch section 12 is formed of an analog switch and the input end is connected to the circuit input terminal $IN_2$. The second switch section 12 is driven on/off by a switch control pulse $\Phi_2$ having a phase opposite to that of the switch control pulse $\Phi_1$, which is supplied from the control unit (not shown), to thereby selectively take in the control waveform $V_{Saw}$.

The differential amplifier 15 includes a non-inverted (+) input end connected to each of the output ends of the switch sections 11 and 12. The capacity section 14 includes one end connected to an inverted (−) input end of the differential amplifier 15. The capacity section 14 includes the other end supplied with a reference voltage $V_{Ref}$. The reference voltage $V_{Ref}$ is a voltage as a reference of the circuit operation of this comparator circuit 10B. The reference voltage $V_{Ref}$ is a fixed voltage that is not affected by the power-supply fluctuation and the like (i.e., not changed by the power-supply fluctuation and the like).

The third switch section 13 is formed of an analog switch and is connected between the inverted input end and the output end of the differential amplifier 15. The third switch section 13 is driven on/off by the same switch control pulse $\Phi_1$ as the first switch section 11, to thereby selectively short-circuit between the inverted input end and the output end of the differential amplifier 15. The fourth switch section 16 is formed of an analog switch and is connected between the output end of the differential amplifier 15 and the input end of the invertor 18. The fourth switch section 16 is driven on/off by the same switch control pulse $\Phi_2$ as the second switch section 12, to thereby selectively short-circuit the output end of the differential amplifier 15 and the input end of the invertor 18.

The fifth switch section 17 is formed of an analog switch and is connected between the input end of the invertor 18 and a predetermined potential node, for example, a power-supply ($V_{DD}$). The fifth switch section 17 is driven on/off by the same switch control pulse all as the first switch section 11, to thereby selectively set the input end of the invertor 18 to have a power-supply potential $V_{DD}$. The invertor 18 derives an output having a phase opposite to the output of the differential amplifier 15 to the circuit output terminal OUT.

The output waveform derived to the circuit output terminal OUT becomes a PWM waveform having a pulse width corresponding to the magnitude (voltage value) of the signal voltage $V_{Sig}$. Note that, in the circuit of FIG. 3, the node of the non-inverted input end of the differential amplifier 15 will be referred to as a node A, the node of the inverted input end will be referred to as a node B, and the node of the output end of the differential amplifier 15 will be referred to as a node C.

The first to second switch sections 11 to 13 and the fourth and fifth switch sections 16, 17 are configured to be formed of an N-channel MOS transistor, a P-channel MOS transistor, or a parallel connection formed of the N-channel MOS transistor and the P-channel MOS transistor.

Figure 4:
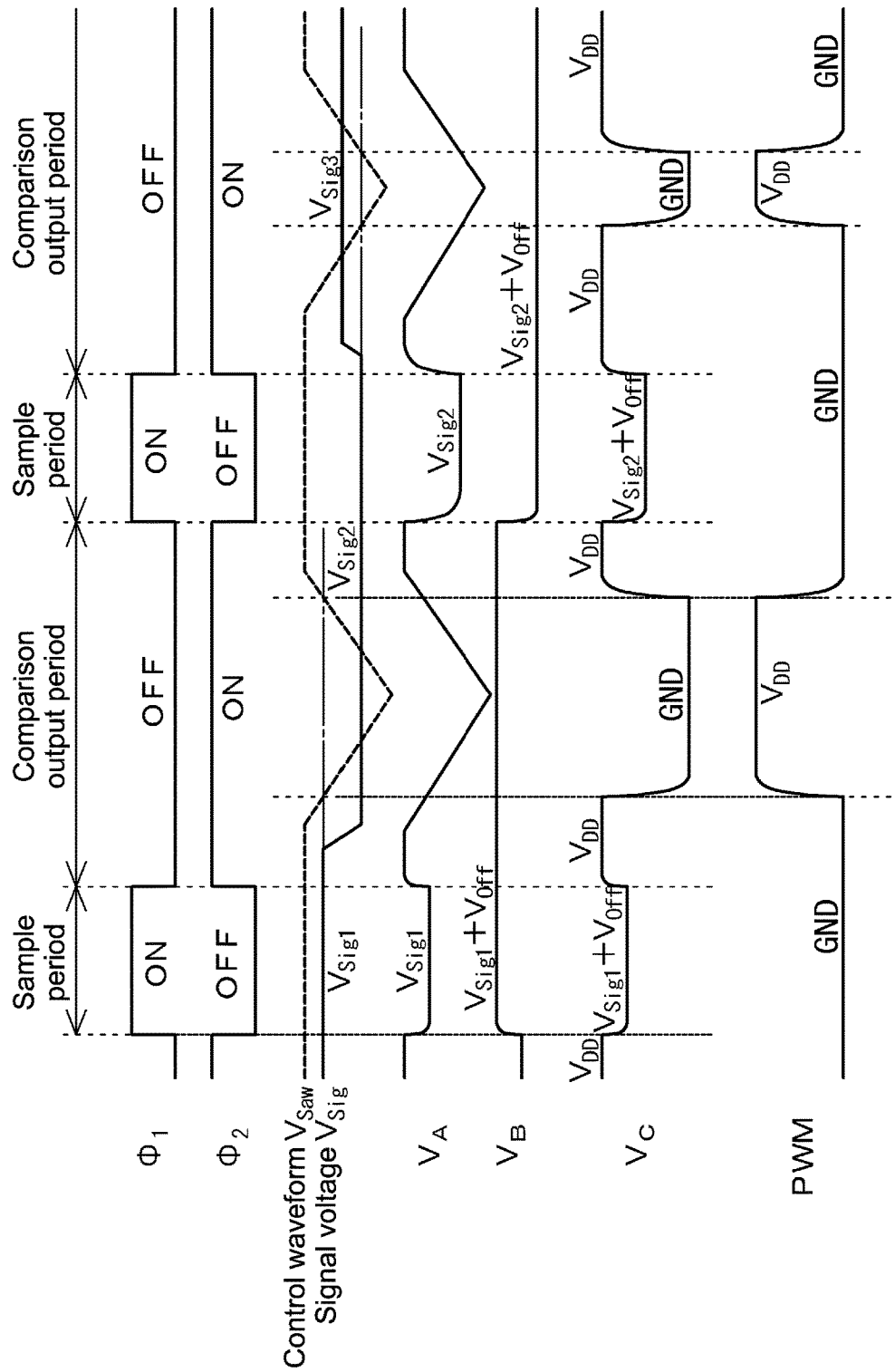
FIG. 4 is a timing waveform diagram for explaining a circuit operation of the comparator circuit according to Embodiment 2.

Next, the circuit operation of the comparator circuit 10B according to Embodiment 2 having the above-mentioned configuration will be described using a timing waveform diagram of FIG. 4. In the timing waveform diagram of FIG. 4, waveforms of the switch control pulses $\Phi_1$, $\Phi_2$, the control waveform $V_{Saw}$, the signal voltage $V_{Sig}$, a potential $V_A$ of the node A, a potential $V_B$ of the node B, a potential $V_C$ of the node C, and a PWM output are shown.

As in the comparator circuit 10A according to Embodiment 1, the comparator circuit 10B according to Embodiment 2 is operated in two periods of a sample period and a comparison output period. First, in the sample period, the switch control pulse $\Phi_1$ becomes active (in this example, high level) and the switch control pulse $\Phi_2$ becomes inactive (in this example, low level). With this, the first switch section 11 is turned on and takes in the signal voltage $V_{Sig}$. At the same time, the third switch section 13 is turned on and electrically short-circuits the inverted input end and the output end of the differential amplifier 15.

The inverted input end and the output end of the differential amplifier 15 are short-circuited. Thus, a negative feedback configuration is obtained. Due to the virtual ground, the potential of the non-inverted input end, the potential of the inverted input end, and the potential of the output end of the differential amplifier 15 become approximately equal. At the same time, due to the taking-in of the signal voltage $V_{Sig}$ by the first switch section 11, the potential of the inverted input end of the differential amplifier 15, that is, the potential $V_A$ of the node A becomes the signal voltage $V_{Sig}$.

Here, assuming that a variation specific to the differential amplifier 15 is denoted by an offset voltage $V_{Off}$, the voltage of ($V_{Sig}+V_{Off}$) is generated in a feedback path of the differential amplifier 15. This voltage ($V_{Sig}+V_{Off}$) generated in the feedback path is also the potential $V_B$ of the node B and the potential $V_C$ of the node C, written in the capacity section 14 including the other end supplied with the reference voltage $V_{Ref}$ that is a fixed voltage, and held until the start of the next sample period.

Furthermore, in the sample period, the fourth switch section 16 is off and the fifth switch section 17 is on. With this, the output end of the differential amplifier 15 and the input end of the invertor 18 are electrically cut off and the power-supply potential $V_{DD}$ is applied to the input end of the invertor 18. Thus, the PWM output that is derived to the circuit output terminal OUT is in a state of the ground potential GND.

Next, when the comparison output period comes, the switch control pulse $\Phi_1$ becomes inactive and the switch control pulse $\Phi_2$ becomes active. With this, instead of the first switch section 11, the second switch section 12 is turned on and takes in the control waveform $V_{Saw}$. At the same time, the third switch section 13 is turned off and electrically opens the part between the inverted input end and the output end of the differential amplifier 15.

Due to the taking-in of the control waveform $V_{Saw}$ by the second switch section 12, the potential $V_A$ of the node A becomes a maximum level of the control waveform $V_{Saw}$. At an initial phase of the comparison output period, the control waveform $V_{Saw}$ is at a maximum level or a level near it, which is higher than the signal voltage $V_{Sig}$ (=signal voltage $V_{Sig1}$) written in the capacity section 14 in the sample period. Therefore, the potential of the output end of the differential amplifier 15, that is, the potential $V_C$ of the node C becomes the power-supply potential $V_{DD}$.

After that, the control waveform $V_{Saw}$ starts to drop. At a timing when the control waveform $V_{Saw}$ drops below the signal voltage $V_{Sig}$ (signal voltage $V_{Sig1}$) written in the sample period, the potential of the output end of the differential amplifier 15, that is, the potential $V_C$ of the node C is inverted to become the ground potential GND. Furthermore, in the comparison output period, the fourth switch section 16 is on and the fifth switch section 17 is off. With this, the output end of the differential amplifier 15 and the input end of the invertor 18 are electrically short-circuited. Thus, the potential of the output end of the differential amplifier 15, that is, the potential $V_C$ of the node C is inverted by the invertor 18 and derived as the PWM output to the circuit output terminal OUT.

Also with the above-mentioned comparator circuit 10B according to Embodiment 2, the circuit configuration using the differential amplifier 15 is employed as in the comparator circuit 10A according to Embodiment 1, and hence a malfunction, for example, a change of the logical threshold due to the power-supply fluctuation and the like does not occur. Thus, it is possible to reduce the influence of the power-supply fluctuation and the like and eliminate the accuracy error of the comparison operation. In addition to this, in the comparator circuit 10B according to Embodiment 2, the following actions and effects can be obtained.

A configuration in which the capacity section 14, which is provided on the side of the input path of the signal voltage $V_{Sig}$ and the control waveform $V_{Saw}$ in the comparator circuit 10A according to Embodiment 1, is provided on the side of the feedback path of the differential amplifier 15 is employed in the comparator circuit 10B according to Embodiment 2. With this, for the circuit that generates the signal voltage $V_{Sig}$ and the control waveform $V_{Saw}$, the driving capability for driving the capacity section 14 having the parasitic capacitances is not needed. Thus, the load on this circuit can be reduced. It can contribute to an increase of the operating speed and a reduction of the power consumption.

Also, a configuration in which the third switch section 13, which is provided on the side of the input path of the signal voltage $V_{Sig}$ and the control waveform $V_{Saw}$ in the comparator circuit 10A according to Embodiment 1, is removed from the side of the input path is employed in the comparator circuit 10B according to Embodiment 2. With this, the voltage is not limited in the operation of the node A unlike the case where the third switch section 13 is provided on the side of the input path of the signal voltage $V_{Sig}$ and the control waveform $V_{Saw}$. Therefore, the dynamic ranges of the signal voltage $V_{Sig}$ and the control waveform $V_{Saw}$ can be ensured. In addition, the potential $V_C$ of the node C is the power-supply potential $V_{DD}$ in the period from the end of the sample period to the start of dropping of the control waveform $V_{Saw}$, and hence the capacity value of the capacity section 14 is not changed by the off leakage current of the third switch section 13.

The comparator circuit 10A according to Embodiment 1 or comparator circuit 10B according to Embodiment 2 described above can be used as a comparator circuit provided in a pixel of a display apparatus using a PWM driving method or a comparator circuit provided at an input stage of an A/D conversion circuit. Hereinafter, descriptions will be made assuming that a display apparatus using the comparator circuit 10A according to Embodiment 1 or the comparator circuit 10B according to Embodiment 2 as the comparator circuit of the pixel is a display apparatus according to Embodiment 3 and an A/D conversion circuit using the comparator circuit 10A according to Embodiment 1 or the comparator circuit 10B according to Embodiment 2 as the comparator circuit at the input stage is an A/D conversion circuit according to Embodiment 4.

Embodiment 3

Figure 5:
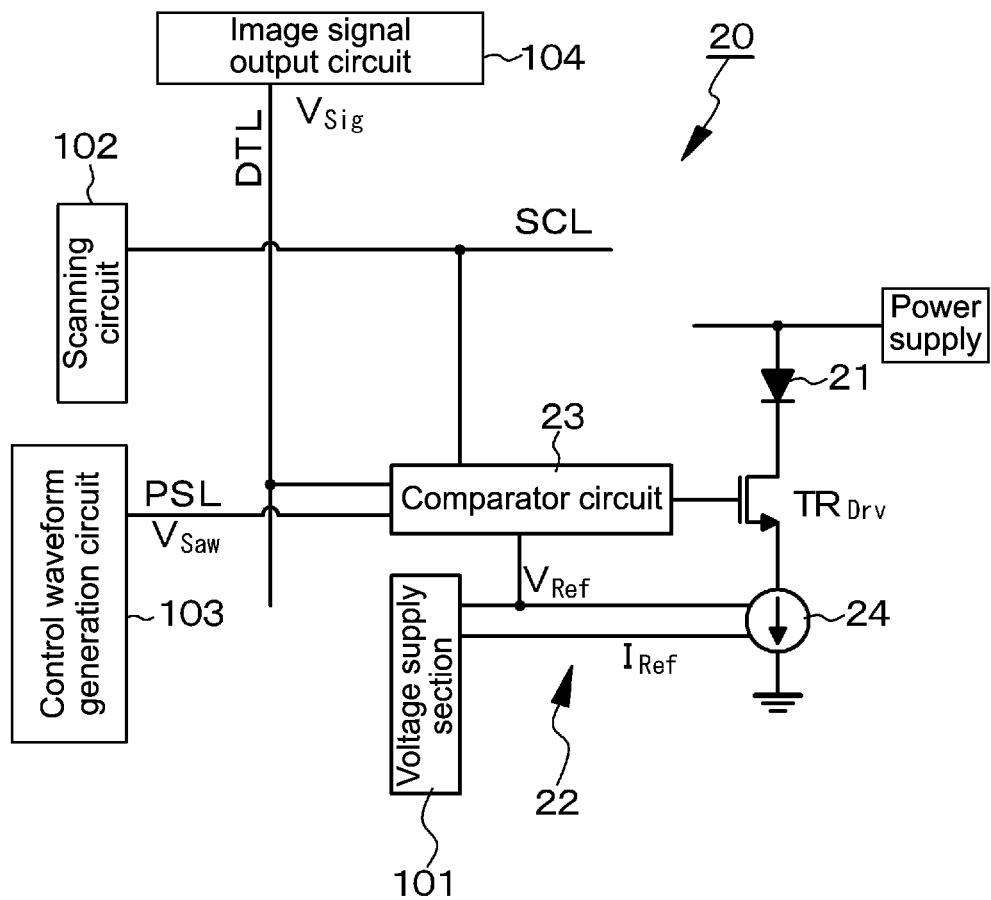
FIG. 5 is a conceptual diagram of a pixel and the like constituted of a light-emitting section and a drive circuit in a display apparatus according to Embodiment 3.
Figure 6:
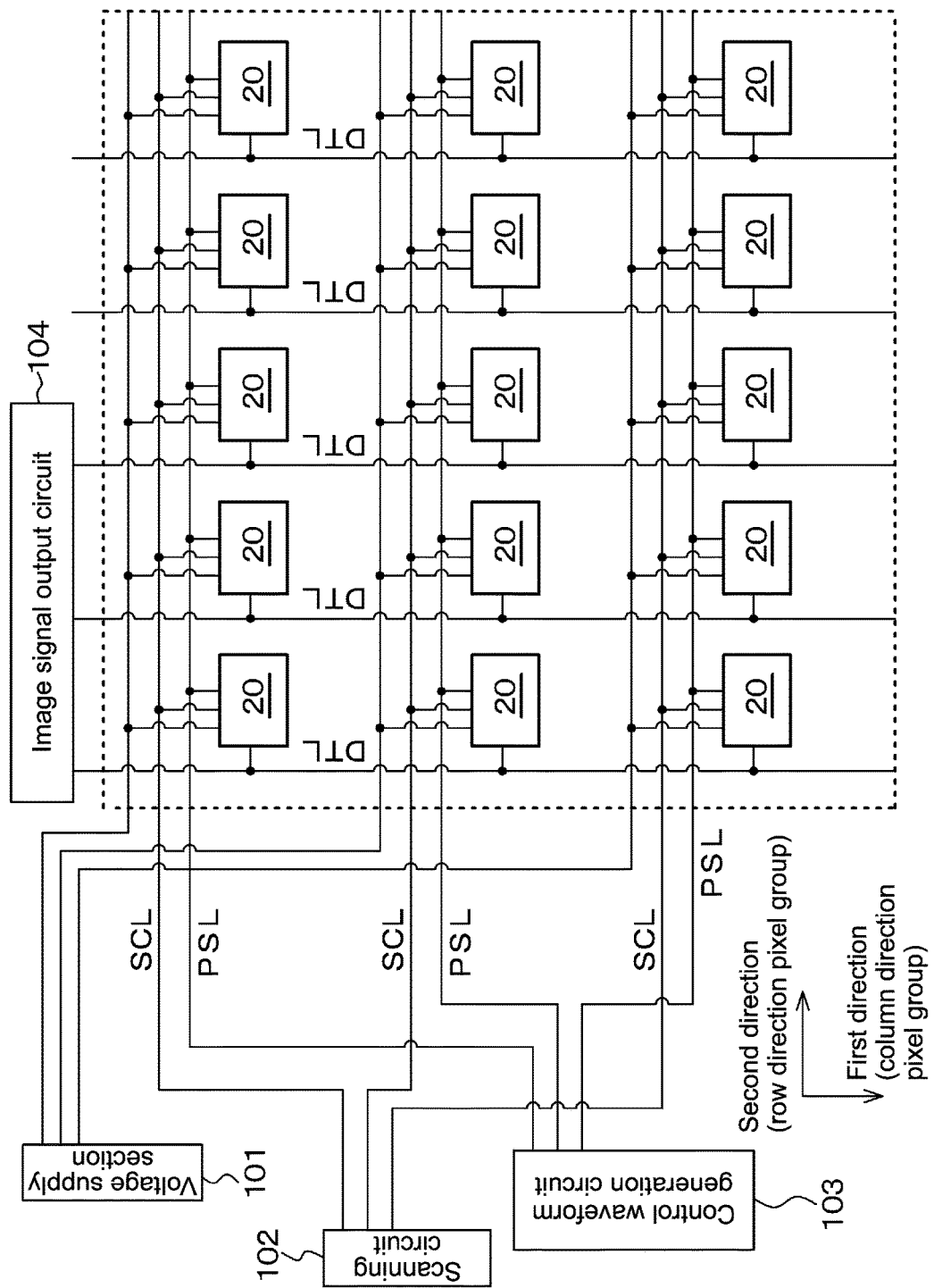
FIG. 6 is a conceptual diagram of circuits constituting the display apparatus according to Embodiment 3.

A conceptual diagram of a pixel and the like configured of a light-emitting section and a drive circuit in the display apparatus according to Embodiment 3 is shown in FIG. 5. A conceptual diagram of circuits constituting the display apparatus according to Embodiment 3 is shown in FIG. 6. Note that, for simplification of the figure, FIG. 6 shows 3*5 pixels.

The display apparatus according to Embodiment 3 is configured such that a plurality of pixels (more specifically, sub-pixels, the same applies hereinafter) 20, each of which is constituted of a light-emitting section 21 and a drive circuit 22 that drives the light-emitting section 21, are arranged in a two-dimensional matrix form. Specifically, the plurality of pixels 20 are arranged in the two-dimensional matrix form in the first direction and the second direction. The pixel group is divided into a P-number of pixel blocks along the first direction. The display apparatus according to Embodiment 3 further includes, as a peripheral driving section for driving the pixel 20, a voltage supply section 101, a scanning circuit 102, a control waveform generation circuit 103, and an image signal output circuit 104.

The light-emitting section 21 is formed of a light-emitting diode (LED) and includes an anode electrode connected to a power-supply section. Each drive circuit 22 of the plurality of pixels 20 includes a comparator circuit 23, a current source 24, and a light-emitting section-driving transistor $TR_{Drv}$. The light-emitting section-driving transistor $TR_{Drv}$ is formed of, for example, an N-channel transistor. It should be noted that it is not limited to the N-channel transistor. The light-emitting section-driving transistor $TR_D$, includes a drain electrode connected to a cathode electrode of the light-emitting section 21 and a source electrode connected to a ground section (ground) via the current source 24.

The comparator circuit 23 is supplied with a control waveform (light-emitting control waveform) $V_{Saw}$ having a voltage variation of sawtooth waveform from the control waveform generation circuit 103 through a control pulse line PSL. At the same time, the comparator circuit 23 is supplied with a signal voltage (light emission intensity signal) $V_{Sig}$ from the image signal output circuit 104 through a data line DTL. Note that the signal voltage $V_{Sig}$ is specifically a video signal voltage for controlling a light-emitting state (luminance) of the pixel 20. The comparator circuit 23 compares the control waveform $V_{Saw}$ with the potential based on the signal voltage $V_{Sig}$ and outputs a predetermined voltage (for sake of convenience, referred to as "first predetermined voltage") based on the comparison result.

The current source 24 is supplied with a reference voltage $V_{Ref}$ and a reference current $I_{Ref}$ from the voltage supply section 101. The current source 24 performs voltage/current conversion based on the reference voltage $V_{Ref}$ and the reference current $I_{Ref}$ and generates a constant current. The light-emitting section-driving transistor $TR_D$, is driven by the first predetermined voltage output from the comparator circuit 23, to thereby supply the light-emitting section 21 with a current and causes a light-emitting section 21 to emit light. That is, the light-emitting section-driving transistor $TR_D$, constitutes a current supply section that supplies the light-emitting section 21 with a current according to an output of the comparator circuit 23 (output of the differential amplifier 15). The reference voltage $V_{Ref}$ is supplied also to the comparator circuit 23. That is, the reference voltage $V_{Ref}$ is supplied from the voltage supply section 101 to the comparator circuit 23 independently from the power-supply section and the ground section corresponding to the current supply section (light-emitting section-driving transistor $TR_{Drv}$).

The comparator circuit 23 is formed of the comparator circuit 10A according to Embodiment 1 or comparator circuit 10B according to Embodiment 2 described above. In the comparator circuit 10A shown in FIG. 1 or the comparator circuit 10B shown in FIG. 3, the first switch section 11 that selectively takes in the signal voltage $V_{Sig}$ is a signal writing switch that samples a signal voltage $V_{Sig}$ supplied from the image signal output circuit 104 through the data line DTL and writes the signal voltage $V_{Sig}$ in the pixel 20.

Each pixel 20 includes the drive circuit 22 including the comparator circuit 23, and hence the display apparatus according to Embodiment 3 causes the light-emitting section 21 to emit light for a time depending on the potential based on the signal voltage $V_{Sig}$. In other words, the display apparatus employs a driving method of PWM-driving the light-emitting section 21. This PWM driving method has an advantage that variations in light emission of the light-emitting section 21 can be reduced.

Figure 7:
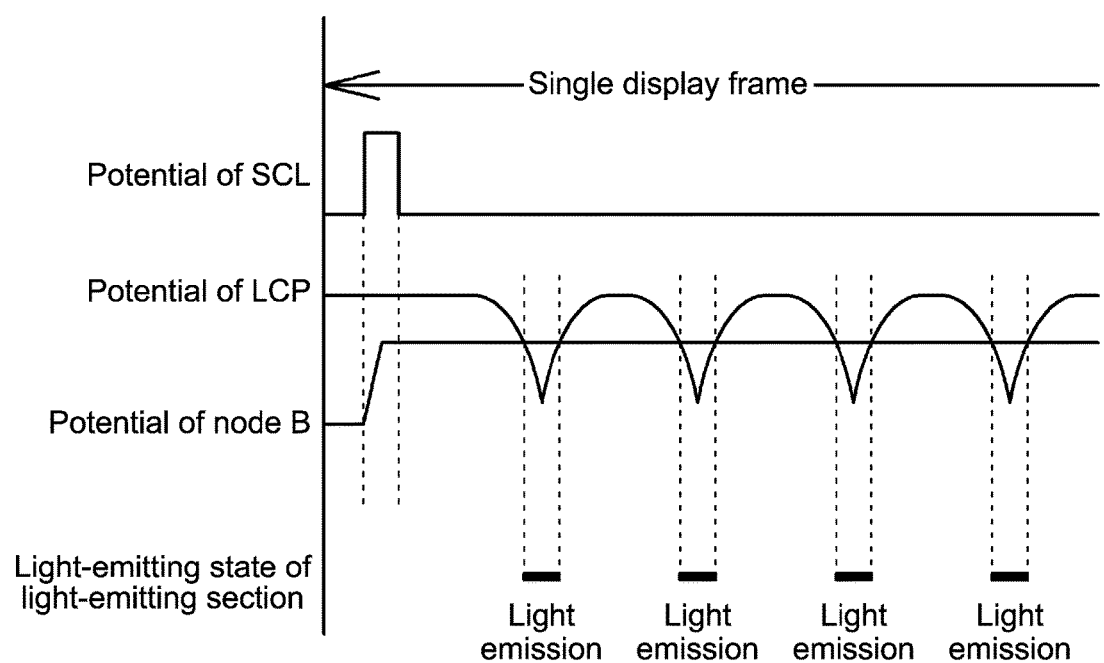
FIG. 7 is a schematic diagram showing a control waveform or the like for explaining an operation of one pixel in the display apparatus according to Embodiment 3.
Figure 8:
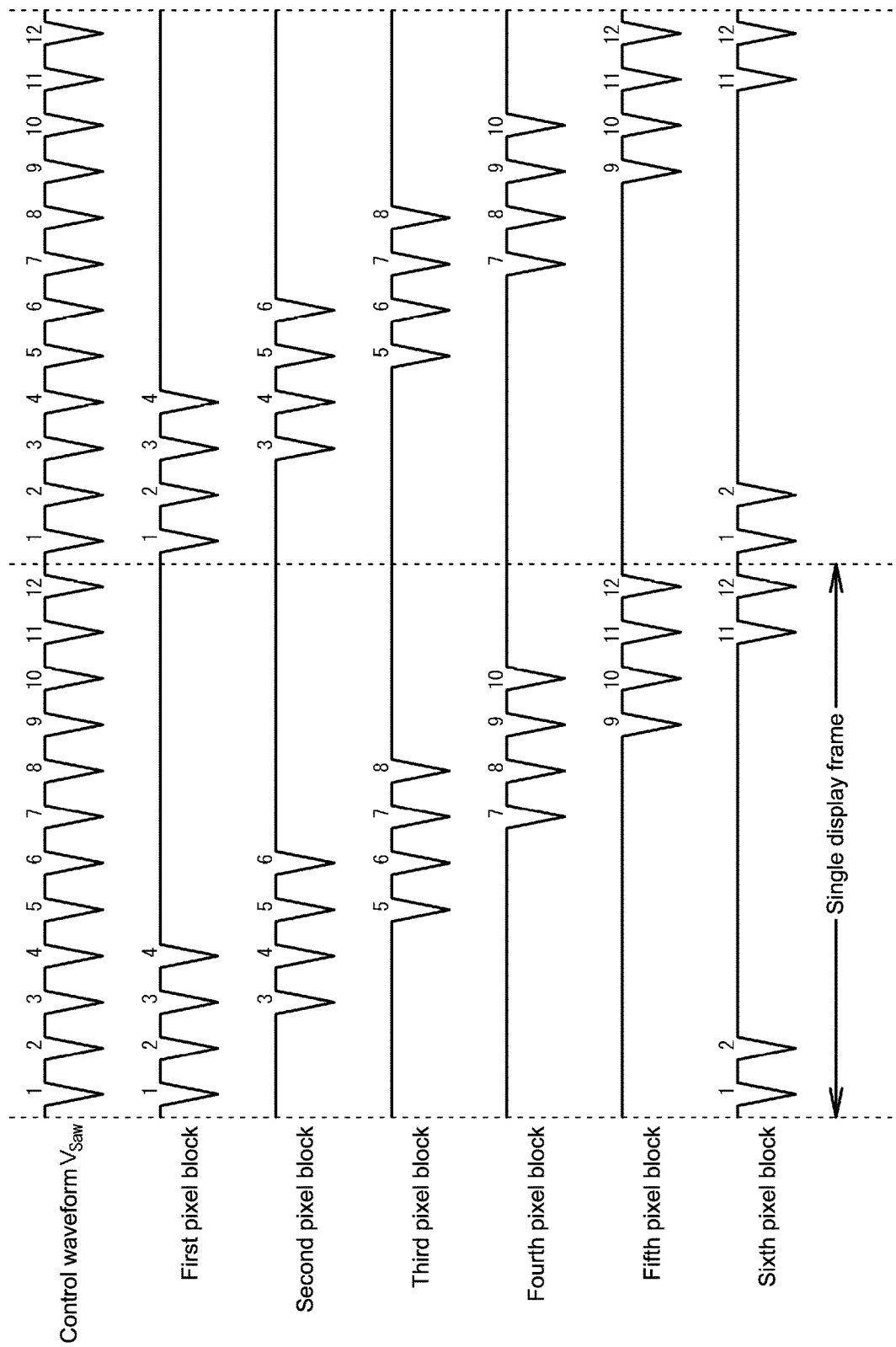
FIG. 8 is a diagram schematically showing supply of a plurality of control waveforms to pixel blocks in the display apparatus according to Embodiment 3.
Figure 9:
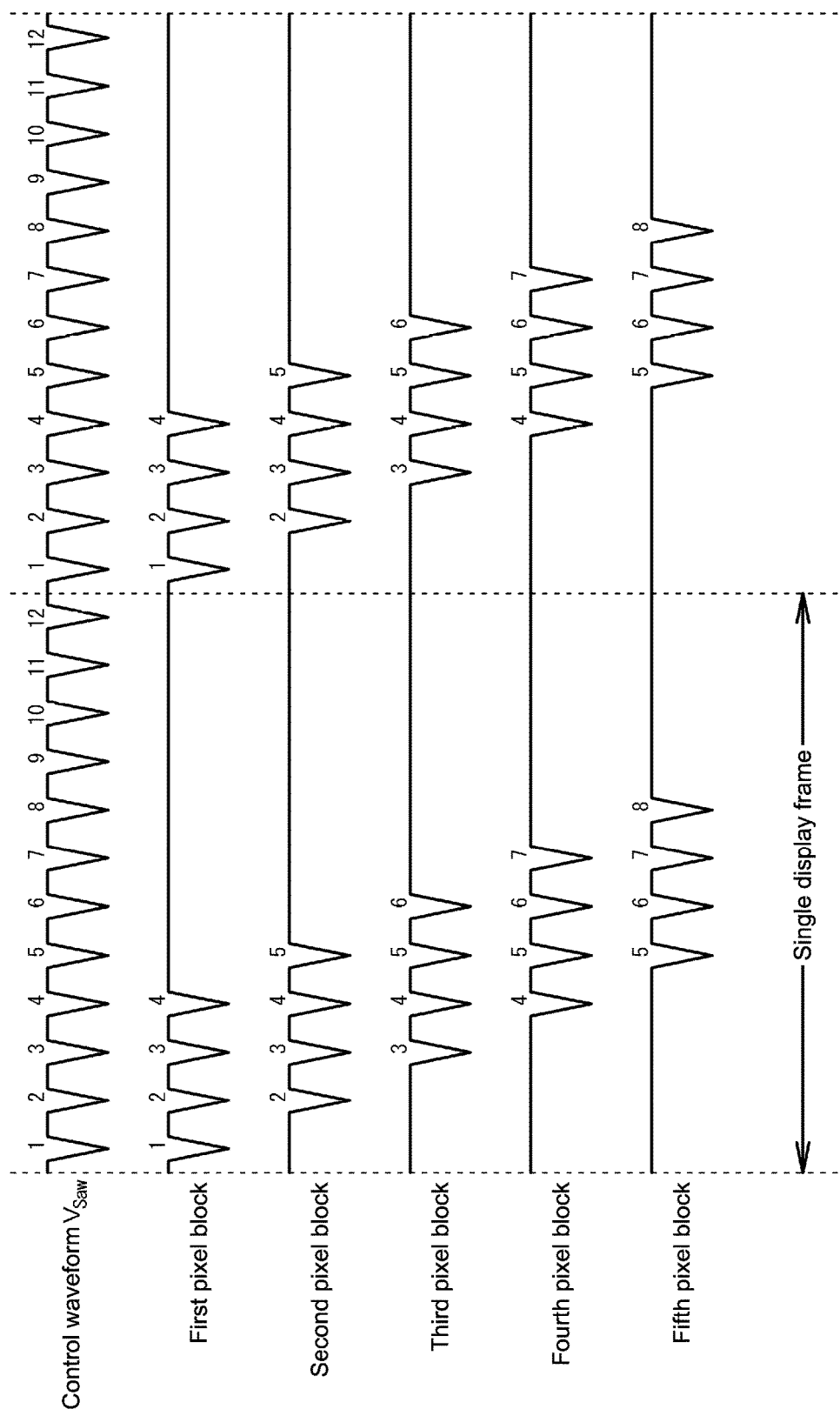
FIG. 9 is a diagram schematically showing supply of a plurality of control waveforms to pixel blocks in a modified example of the display apparatus according to Embodiment 3.

FIG. 7 shows a schematic diagram showing a control waveform $V_{Saw}$ or the like for explaining the operation of a single pixel in the display apparatus according to Embodiment 3. Furthermore, supply of a plurality of control waveforms $V_{Saw}$ to the pixel blocks is schematically shown in FIG. 8. In FIGS. 8 and 9 described later, the sawtooth waveform of the control waveform $V_{Saw}$ is indicated by triangles for the sake of convenience.

The display apparatus according to Embodiment 3 is a display apparatus that is configured such that the plurality of pixels 20, each of which is constituted of the light-emitting section 21 and the drive circuit 22 that drives the light-emitting section 21, are arranged in the two-dimensional matrix form in the first direction and the second direction and the pixel group is divided into a P-number of pixel blocks along the first direction. Then, the light-emitting sections 21 from the light-emitting sections 21 constituting the pixels 20 belonging to the first pixel block to the light-emitting sections 21 constituting the pixels 20 belonging to the Pth pixel block are caused to sequentially emit light for each pixel block at the same time. Furthermore, when the light-emitting sections 21 constituting the pixels 20 belonging to some pixel blocks emit light, the light-emitting sections 21 constituting the pixels 20 belonging to the remaining pixel block are prevented from emitting light.

For example, assumed is a full HD high-definition full color display apparatus whose number of pixels in the horizontal direction (second direction) of the screen is 1920 and whose number of pixels in the vertical direction (first direction) of the screen is 1080. The pixel group is divided into a P-number of pixel blocks along the first direction. Here, as an example, P=6 is assumed. Thus, the first pixel block includes a pixel group of a first row to a pixel group of a 180th row, a second pixel block includes a pixel group of a 181th row to a pixel group of a 360th row, a third pixel block includes a pixel group of a 361th row to a pixel group of a 540th row, a fourth pixel block includes a pixel group of a 541th row to a pixel group of a 720th row, a fifth pixel block includes a pixel group of a 721th row to a pixel group of a 900th row, and a sixth pixel block includes a pixel group of a 901th row to a pixel group of a 1080th row.

Hereinafter, an operation of each pixel in the first pixel block will be described.

[Signal Voltage Write-In Period]

As described in Embodiment 1 to Embodiment 3, in the comparator circuit 10A shown in FIG. 1 or the comparator circuit 10B shown in FIG. 3, charges corresponding to the potential of the data line DTL, that is, the potential based on the signal voltage $V_{Sig}$ are accumulated. In other words, the capacity section 14 retains the potential based on the signal voltage $V_{Sig}$.

Here, in the first pixel block, the drive circuits 22 (specifically, the first switch section 11 that is the signal writing switch, the same applies hereinafter) in all the pixels (row direction pixel group) belonging to one column arranged in the second direction are brought into an operating state at the same time. In the first pixel block, the operations in which the drive circuits 22 in all the pixels (row direction pixel group) belonging to one column arranged in the second direction are brought into an operating state at the same time are sequentially performed from the drive circuits 22 in all the pixels (row direction pixel group of first row) belonging to the first row arranged in the first direction to the drive circuits 22 in all the pixels (row direction pixel group of last row) belonging to the last row (specifically, the 180th row).

[Pixel Block Light-Emitting Period]

In the first pixel block, when the above-mentioned operations are completed, the first pixel block is supplied with the control waveforms $V_{Saw}$ from the control waveform generation circuit 103. That is, the drive circuits 22 (specifically, the first switch section 11) constituting all the pixels 20 in the first pixel block are brought into the operating state at the same time. The light-emitting sections 21 in all the pixels 20 belonging to the first pixel block emit light. The absolute value of the voltage of the single control waveform $V_{Saw}$ decreases (drops) and then increases (rises) with elapse of time. Gamma correction is performed based on the voltage of the control waveform $V_{Saw}$ changing with elapse of time. That is, an absolute value of a rate of variation (differential value) of the voltage of the control waveform $V_{Saw}$ with a time being a variable is proportional to a constant of 2.2.

In the example shown in FIG. 7, in the signal voltage write-in period, the voltage of the control waveform $V_{Saw}$ is equal to or larger than 3 volts, for example. Thus, in the signal voltage write-in period, the comparator circuit 23 (10A, 10B) outputs a second predetermined voltage (low level) from an output section, and hence the light-emitting section-driving transistor $TR_{Drv}$ is off. In the pixel block light-emitting period, when the voltage of the control waveform $V_{Saw}$ starts to drop and a sawtooth waveform voltage of the control waveform $V_{Saw}$ reaches the potential based on the signal voltage $V_{Sig}$, the comparator circuit 23 (10A, 10B) outputs the first predetermined voltage (high level) from the output section. As a result, the light-emitting section-driving transistor $TR_{Drv}$ is turned on. The light-emitting section 21 is supplied with a current from a current supply line CSL. The light-emitting section 21 emits light.

The voltage of the control waveform $V_{Saw}$ drops to about one volt and then rises. When it becomes above the sawtooth waveform voltage of the control waveform $V_{Saw}$ and the potential based on the signal voltage $V_{Sig}$, the comparator circuit 23 (10A, 10B) outputs the second predetermined voltage (low level) from the output section. As a result, the light-emitting section-driving transistor $TR_{Drv}$ is turned off, supply of a current from the current supply line CSL to the light-emitting section 21 is cut off, and the light-emitting section 21 stops emitting light (extinguishes light). That is, only while the potential based on the signal voltage (light emission intensity signal) $V_{Sig}$ cuts off the sawtooth waveform of the control waveform $V_{Saw}$, it is possible to cause the light-emitting section 21 to emit light. The luminance of the light-emitting section 21 at this time depends on the cut-off time.

That is, the time when the light-emitting section 21 emits light is based on the potential retained by the capacity section 14 of the comparator circuit 23 (10A, 10B) and the voltage of the control waveform $V_{Saw}$ supplied from the control waveform generation circuit 103. Gamma correction is performed based on the sawtooth waveform voltage of the control waveform $V_{Saw}$ changing with elapse of time. That is, the absolute value of the rate of variation of the voltage of the control waveform $V_{Saw}$ with the time being a variable is proportional to a constant of 2.2. Therefore, it is necessary to provide a circuit for gamma correction. For example, a method of using a control waveform $V_{Saw}$ having a linear sawtooth waveform voltage (triangle waveform) and varying the signal voltage $V_{Sig}$ proportionally to a 2.2th power with respect to a linear luminance signal is conceivable. However, the voltage variation is actually too small at low luminance. In particular, in order to realize such a voltage variation by digital processing, a large number of bits is needed. Thus, this method cannot be considered as effective.

The display apparatus according to Embodiment 3 includes the single control waveform generation circuit 103. The variation of the voltage of the control waveform $V_{Saw}$ is very sharp at a low gradation portion (low voltage portion) as schematically shown in FIG. 7. In particular, it is sensitive to the waveform quality of the control waveform $V_{Saw}$ at this portion. Therefore, it is necessary to consider variations in the control waveform $V_{Saw}$ generated in the control waveform generation circuit 103. Thus, the display apparatus according to Embodiment 3 includes the single control waveform generation circuit 103, and hence substantially no variations in the control waveform $V_{Saw}$ generated in the control waveform generation circuit 103 occur. That is, it is possible to cause the entire display apparatus to emit light at the same control waveform $V_{Saw}$, and hence to prevent variations of the light-emitting state.

Furthermore, the absolute value of the voltage of the control waveform $V_{Saw}$ decreases and then increases with elapse of time, and hence it is possible to cause the light-emitting section constituting the all pixels (more specifically, all the sub-pixels) belonging to the single pixel block to emit light at the same timing. That is, the temporal centers of light emission of the light-emitting sections constituting all the pixels belonging to each pixel block can be aligned with each other (made identical to each other). Thus, it is possible to reliably prevent vertical lines (vertical stripes) in the image, which would otherwise be generated due to delays in light emission in the column direction pixel group.

In the display apparatus according to Embodiment 3, based on the plurality of control waveforms $V_{Saw}$, the light-emitting section 21 emits light a plurality of times. Otherwise, the light-emitting section 21 emits light a plurality of times based on the plurality of control waveforms $V_{Saw}$ each having a voltage variation of sawtooth waveform that are supplied to the drive circuit 22 and the potential based on the signal voltage $V_{Sig}$. Otherwise, in the control waveform generation circuit 103, the light-emitting section 21 emits light a plurality of times based on the plurality of control waveforms $V_{Saw}$. The time intervals of the plurality of control waveforms $V_{Saw}$ are constant. Specifically, in the display apparatus according to Embodiment 3, in the pixel block light-emitting period, four control waveforms $V_{Saw}$ are transmitted to all the pixels 20 constituting each pixel block and each pixel 20 emits light four times.

As schematically shown in FIG. 8, in the display apparatus according to Embodiment 3, in the one display frame, twelve control waveforms $V_{Saw}$ are supplied to the six pixel blocks. The number of control waveforms $V_{Saw}$ supplied to the drive circuit 22 in the one display frame is smaller than the number of control waveforms $V_{Saw}$ in the one display frame. Otherwise, in the control waveform generation circuit 103, the number of control waveform $V_{Saw}$ supplied to the drive circuit 22 in the one display frame is smaller than the control waveform $V_{Saw}$ in the one display frame. Specifically, in the example shown in FIG. 8, the number of control waveforms $V_{Saw}$ in the one display frame is twelve and the number of control waveforms $V_{Saw}$ supplied to the drive circuit 22 in the one display frame is four. Regarding the adjacent pixel blocks, two control waveforms $V_{Saw}$ overlap each other. In other words, the two adjacent pixel blocks are brought into the light-emitting state at the same time. Furthermore, the first pixel block and a last pixel block are both brought into the light-emitting state at the same time. This form can be achieved in the following manner. Specifically, a sequence of control waveforms $V_{Saw}$ is generated in the one display frame. Then, when the light-emitting sections 21 constituting the pixels 20 belonging to one pixel block are prevented from emitting light, a part of the sequence of control waveforms $V_{Saw}$ is masked and the drive circuit 22 constituting the pixels 20 belonging to the one pixel block is not supplied with the control waveforms $V_{Saw}$. Specifically, for example, using the multiplexer, it is only necessary to take out a part (four continuous control waveforms $V_{Saw}$) from a series of control waveforms $V_{Saw}$ in the one display frame and supply it to the drive circuit 22.

That is, the control waveform generation circuit 103 according to Embodiment 3 is a control pulse generation circuit that generates the control waveform $V_{Saw}$ having a voltage variation of sawtooth waveform for controlling the drive circuit 22 in the display apparatus configured such that the plurality of pixels 20 are arranged in the two-dimensional matrix form of the first direction and the second direction and the pixel group is divided into the P-number of pixel blocks along the first direction. When the control waveform generation circuit 103 sequentially supplies the control waveforms $V_{Saw}$ for each pixel block at the same time from the drive circuit 22 constituting the pixels 20 belonging to the first pixel block to the drive circuit 22 constituting the pixels 20 belonging to the Pth pixel block, and supplies the control waveform $V_{Saw}$ to the drive circuit 22 constituting the pixels 20 belonging to some pixel blocks, the control waveform generation circuit 103 does not supply the control waveforms $V_{Saw}$ to the drive circuit 22 constituting the pixels 20 belonging to the remaining pixel block. Here, when the control waveform generation circuit 103 generates the sequence of control waveforms $V_{Saw}$ in the one display frame and prevents the light-emitting sections 21 constituting the pixels 20 belonging to the one pixel block to emit light, the control waveform generation circuit 103 does not mask a part of the sequence of control waveforms $V_{Saw}$ and does not supply the drive circuit 22 constituting the pixels 20 belonging to the one pixel block with the control waveforms $V_{Saw}$.

Figure 10:
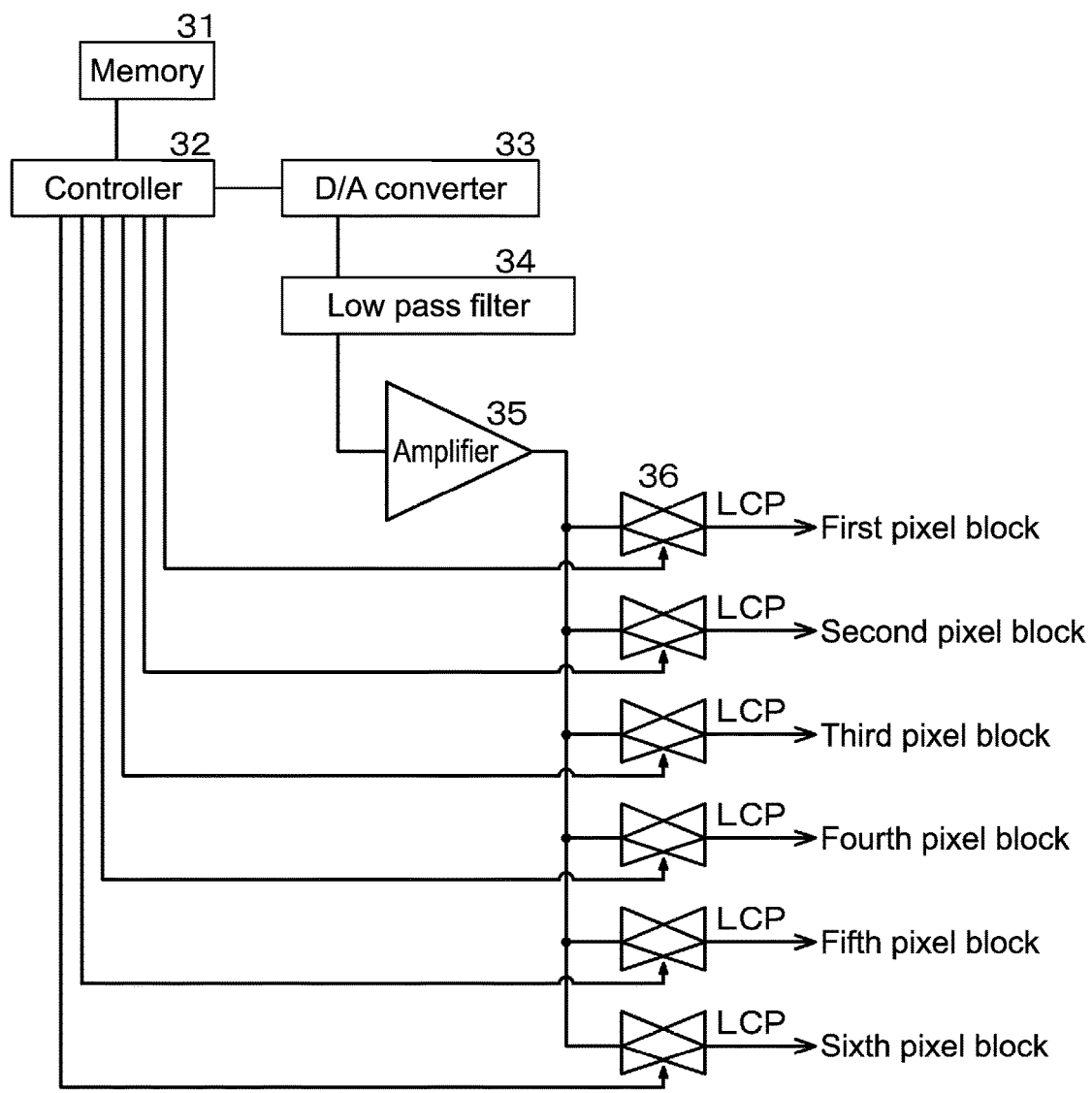
FIG. 10 is a conceptual diagram of a control waveform generation circuit in the display apparatus according to Embodiment 3.

More specifically, as shown in a conceptual diagram of FIG. 10, in the control waveform generation circuit 103, waveform data of the control waveform $V_{Saw}$ stored in a memory 31 is read out by a controller 32 and the read out waveform data is transmitted to a D/A converter 33. Then, it is converted into a voltage by the D/A converter 33 and the voltage is integrated by a low-pass filter 34. In this way, control waveforms $V_{Saw}$ having a 2.2th-power curve are produced.

The control waveforms $V_{Saw}$ are distributed to a plurality of (six in Embodiment 3) multiplexers 36 via an amplifier 35. Under the control of the controller 32, only a needed part of the sequence of control waveforms $V_{Saw}$ is passed by the multiplexers 36 and the other part is masked. In this manner, desired control waveform groups (specifically, six control waveform groups each formed of four continuous control waveforms $V_{Saw}$) are produced. Note that they originate from the single sawtooth waveform, and hence it is possible to reliably prevent variations in generation of the control waveforms $V_{Saw}$ in the control waveform generation circuit 103.

The above-mentioned operations in the signal voltage write-in period and the pixel block light-emitting period are sequentially performed from the first pixel block to the sixth pixel block. That is, as shown in FIG. 8, the light-emitting sections 21 from the light-emitting sections 21 constituting the pixels 20 belonging to the first pixel block to the light-emitting sections 21 constituting the pixels 20 belonging to the Pth pixel block are caused to sequentially emit light for each pixel block.

In addition, when the light-emitting sections 21 constituting the pixels 20 belonging to some pixel blocks are caused to emit light, the light-emitting sections 21 constituting the pixels 20 belonging to the remaining pixel blocks are prevented from emitting light. Note that, in the one display frame, any one of the pixel blocks always emits light.

By the way, the conventional driving method in which video signal voltages are written in all the pixels in a state in which the light emission of all the pixels is stopped in a first period at the start of a one-display frame period and the light-emitting sections of all the pixels are caused to emit light in at least one light-emitting period determined by the video signal voltages written in the pixels in a second period has the following problems. That is, the video signals are evenly transmitted over the time of the one display frame in many cases. Thus, in a television reception system, a method of causing all the pixels to emit light at the same time is also conceivable if a perpendicular blanking interval is applied to the second period. However, the perpendicular blanking interval is typically a time period equivalent to about 4% of the one display frame. Therefore, the light-emitting efficiency of the display apparatus becomes too low. Furthermore, for writing the video signals transmitted over the one display frame in all the pixels in the first period, it is necessary to prepare a large signal buffer. In addition, for transmitting the video signals to the pixels at a speed equal to or higher than the rate of the transferred video signals, it is necessary to devise a signal transmission circuit. In addition, all the pixels are caused to emit light at the same time in the second period, which leads to concentration of the light-emitting power in the short time. Thus, there is also a problem in that the power-supply design becomes difficult.

In contrast, in the display apparatus according to Embodiment 3, when the light-emitting sections 21 constituting the pixels 20 belonging to some pixel blocks (e.g., first and second pixel blocks) are caused to emit light, the light-emitting sections 21 constituting the pixels 20 belonging to the remaining pixel blocks (e.g., third to sixth pixel blocks) are caused to emit light. Thus, in driving the display apparatus according to the PWM driving method, it becomes possible to prolong the light-emitting period and increase the light-emitting efficiency.

In addition, it is unnecessary to write the video signals transmitted over the one display frame in all the pixels 20 at the same time in a certain period. In other words, as in the conventional display apparatus, it is only necessary to sequentially write the video signals transmitted over the one display frame for each row direction pixel group. Thus, it is unnecessary to prepare the large signal buffer. Furthermore, it is also unnecessary to devise the signal transmission circuit for transmitting the video signals to the pixels at the speed equal to or higher than the rate of the transferred video signals.

In addition, in the light-emitting period of the pixels, all the pixels 20 are not caused to emit light at the same time. That is, for example, when the light-emitting sections constituting the pixels belonging to the first and second pixel blocks are caused to emit light, the light-emitting sections constituting the pixels belonging to the third to sixth pixel blocks are not caused to emit light. Thus, the concentration of the light-emitting power in the short time is prevented and the power-supply design becomes easy.

FIG. 9 schematically shows supply of a plurality of control waveforms $V_{Saw}$ to pixel blocks in a modified example of the display apparatus of Embodiment 3. In this example, P=5 is assumed. Thus, the first pixel block includes a pixel group of the first row to a pixel group of a 216th row, the second pixel block includes a pixel group of a 217th row to a pixel group of a 432th row, the third pixel block includes a pixel group of a 433th row to a pixel group of a 648th row, the fourth pixel block includes a pixel group of a 649th row to a pixel group of a 864th row, and the fifth pixel block includes a pixel group of a 865th row to a pixel group of a 1080th row.

Also in the example shown in FIG. 9, in the pixel block light-emitting period, four control waveforms $V_{Saw}$ are transmitted to all the pixels 20 constituting each pixel block and each pixel 20 emits light four times. In the one display frame, twelve control waveforms $V_{Saw}$ are supplied to the five pixel blocks. The number of control waveforms $V_{Saw}$ supplied to the drive circuit 22 in the one display frame is smaller than the number of control waveforms $V_{Saw}$ in the one display frame. Specifically, also in the example shown in FIG. 9, the number of control waveforms $V_{Saw}$ in the one display frame is twelve and the number of control waveforms $V_{Saw}$ supplied to the drive circuit 22 in the one display frame is four. It should be noted that, unlike the example shown in FIG. 8, the pixel blocks not emitting light are present in the one display frame. Regarding the adjacent pixel blocks, three control waveforms $V_{Saw}$ overlap each other. In the five pixel blocks, the light-emitting states of at most four of the pixel blocks overlap each other. In this manner, a larger number of pixel blocks are brought into the light-emitting state at the same time in comparison with the example shown in FIG. 8, and hence it is possible to further improve the image display quality.

By using the comparator circuit 10A according to Embodiment 1 or the comparator circuit 10B according to Embodiment 2 as the comparator circuit 23 provided in each pixel 20 in the display apparatus that drives the light-emitting section 21 to emit light according to the above-mentioned PWM driving method, the following actions and effects can be obtained.

That is, in the display apparatus using the PWM driving method, if the accuracy error occurs in the comparison operation of the comparator circuit 23 due to the power-supply fluctuation or the like, the light-emitting section 21 cannot be driven in a light-emitting time corresponding to the magnitude of the signal voltage $V_{Sig}$, and hence a desired luminance, that is, a luminance corresponding to the magnitude of the signal voltage $V_{Sig}$ cannot be obtained. However, the comparator circuit 10A according to Embodiment 1 or the comparator circuit 10B according to Embodiment 2 can reduce the influence of the power-supply fluctuation and the like and eliminate the accuracy error of the comparison operation. Thus, even if the power-supply fluctuation or the like occurs, the luminance corresponding to the magnitude of the signal voltage $V_{Sig}$, that is, a desired display image can be obtained.

In particular, in the case where the pixels 20 are formed not on an insulator such as a glass substrate but on a semiconductor such as a silicone, each of the transistors does not include three terminals of source/gate/drain but includes four terminals of source/gate/drain/back gate(base). In the case where an N-channel transistor is used as the transistor constituting each pixel 20, the back gate is connected to the ground. In the case where a P-channel transistor is used as the transistor constituting each pixel 20, the back gate is connected to the power-supply.

In this manner, in the case where the pixels 20 are formed on the semiconductor, for example, if a large current flows into the light-emitting section-driving transistors $TR_D$, of the plurality of pixels 20 in units of pixel row when the light-emitting sections 21 are driven to emit light, the potential of the power-supply or ground may be changed. However, by using the comparator circuit 10A according to Embodiment 1 or the comparator circuit 10B according to Embodiment 2 as the comparator circuit 23, it is possible to reduce the above-mentioned influence of the power-supply fluctuation in the comparator circuit 23 and accurately perform the comparison operation. Thus, the technique of Embodiment 1 or Embodiment 2 is useful when it is applied particularly to the display apparatus using the PWM driving method in which the pixels 20 are formed on the semiconductor.

Embodiment 4

Next, Embodiment 4 using the comparator circuit 10A according to Embodiment 1 or the comparator circuit 10B according to Embodiment 2 as a comparator circuit provided at an input stage of an A/D conversion circuit will be described. In Embodiment 4, it is assumed that the description will be made exemplifying a case where the comparator circuit 10A according to Embodiment 1 or the comparator circuit 10B according to Embodiment 2 is used as an A/D conversion circuit in a solid-state image pickup device of a column parallel A/D conversion system.

Figure 11:
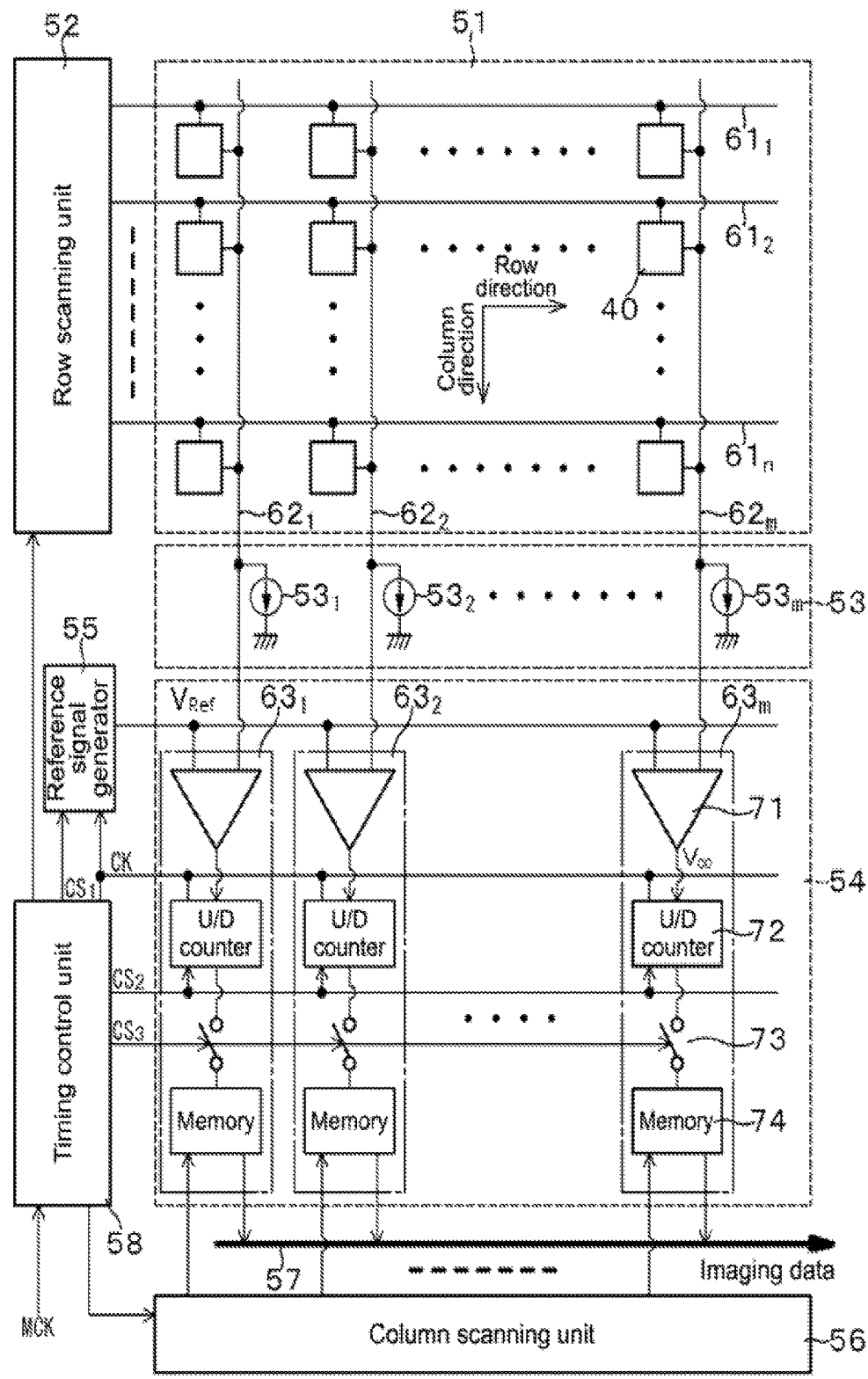
FIG. 11 is a system configuration diagram schematically showing a configuration of a solid-state image pickup device of a column parallel A/D conversion system according to Embodiment 4.

FIG. 11 is a system configuration diagram schematically showing a configuration of the solid-state image pickup device according to Embodiment 4, for example, a CMOS image sensor as one of X-Y address type solid-state image pickup devices. Here, the CMOS image sensor means an image sensor manufactured by applying or partially using a CMOS process.

[System Configuration]

As shown in FIG. 11, the CMOS image sensor according to Embodiment 4 includes a pixel array section 51 configured such that a plurality of pixels 40 are arranged in a two-dimensional matrix form, a peripheral driving system that drives each pixel 40 of the pixel array section 51, and a signal processing system. In this example, as the peripheral driving system and the signal processing system, for example, a row scanning unit 52, a current source section 53, a column processing unit 54, a reference signal generator 55, a column scanning unit 56, a horizontal output line 57, and a timing control unit 58 are provided. The driving system and the signal processing system are integrated on the same semiconductor substrate (chip) as the pixel array section 51.

In this system configuration, the timing control unit 58 generates, based on a master clock MCK, a clock signal CK, control signals $CS_1$ to $CS_3$, and the like serving as references of operations of the row scanning unit 52, the column processing unit 54, the reference signal generator 55, the column scanning unit 56, and the like. The clock signal CK, the control signals $CS_1$ to $CS_3$, and the like generated by the timing control unit 58 are supplied to the row scanning unit 52, the column processing unit 54, the reference signal generator 55, the column scanning unit 56, and the like as driving signals therefor.

The pixel array section 51 has a configuration in which the pixels 40, each of which generates and accumulates photocharges according to the amount of received light, are arranged in a row direction and a column direction, that is, in the two-dimensional matrix form. Here, the row direction means an arrangement direction (i.e., horizontal direction) of the pixels of the pixel row and the column direction means an arrangement direction (i.e., vertical direction) of the pixels of the pixel column.

In this pixel array section 51, with respect to the pixel arrangement in the matrix form, row control lines 61 ($61_1$ to $61_n$) are wired along the row direction for each pixel row and column signal lines 62 ($62_1$ to $62_m$) are wired along the column direction for each pixel column. The row control lines 61 transmit control signals for control in reading out signals from the pixels 40. Although FIG. 11 shows the row control lines 61 as a single wire, it is not limited to one. Ends of the row control lines $61_1$ to $61_n$ are connected to output ends corresponding to the columns of the row scanning unit 52. The column signal lines $62_1$ to $62_m$ are connected to current sources $53_1$ to $53_m$.

The row scanning unit 52 is constituted of a shift register, an address decoder, and the like and drives the pixels 40 of the pixel array section 51 at the same time, in units of row, or the like. That is, the row scanning unit 52 constitutes a driving unit that drives each pixel 40 of the pixel array section 51 together with the timing control unit 58 that controls the row scanning unit 52. A specific configuration of this row scanning unit 52 is not shown in the figure. In general, the row scanning unit 52 includes two scanning systems of a read-out scanning system and a sweep-out scanning system.

For reading out the signals from the pixels 40, the read-out scanning system selectively sequentially scans the pixels 40 of the pixel array section 51 in units of row. The signals read out from the pixels 40 are analog signals. The sweep-out scanning system performs, on a read-out row in which the read-out scanning is performed by the read-out scanning system, sweep-out scanning preceding the read-out scanning by a time corresponding to a shutter speed. The sweep-out scanning by the sweep-out scanning system sweeps out unnecessary charges from photoelectric conversion sections of the pixels 40 of the read-out row, such that the photoelectric conversion sections are reset. By the sweep-out scanning system sweeping out (resetting) the unnecessary charges, a so-called electronic shutter operation is performed. Here, the electronic shutter operation means an operation of removing photocharges from the photoelectric conversion sections and starting new exposure (starting accumulation of photocharges).

The signals read out in the read-out operation by the read-out scanning system correspond to the amount of light received after the previous read-out operation or the electronic shutter operation. A period from the read-out timing of the previous read-out operation or the sweep-out timing of the electronic shutter operation to the read-out timing of the current read-out operation is an exposure period of the photocharges in the pixels 40.

The column processing unit 54 includes A/D conversion circuits 63 ($63_1$ to $63_m$) provided having a one-to-one corresponding relationship for each pixel column of the pixel array section 51, that is, for each of the column signal lines 62 ($62_1$ to $62_m$), for example. The A/D conversion circuits 63 ($63_1$ to $63_m$) convert the analog signals (pixel signals), which are output from the pixels 40 of the pixel array section 51 through the column signal lines $62_1$ to $62_m$ for each column, into digital signals.

The reference signal generator 55 generates a so-called reference signal $V_{Ref}$ having a ramp waveform whose voltage value varies in a stepwise manner with elapse of time. The reference signal generator 55 can be configured by using, for example, a D/A (digital/analog) conversion circuit. Note that the reference signal generator 55 is not limited to have the configuration using the D/A conversion circuit.

Under the control of a control signal $CS_1$ supplied from the timing control unit 58, the reference signal generator 55 generates a reference signal $V_{Ref}$ of a ramp wave based on the clock signal CK supplied from the timing control unit 58. The reference signal generator 55 supplies the generated reference signal $V_{Ref}$ to the A/D conversion circuits $63_1$ to $63_m$ of the column processing unit 54.

The A/D conversion circuits $63_1$ to $63_m$ all have the same configuration. Here, exemplifying the A/D conversion circuit $63_m$, a specific configuration thereof will be described. The A/D conversion circuit $63_m$ includes a comparator circuit 71, a counting means, for example, an up/down counter (indicated as "U/D counter" in FIG. 72, a transfer switch 73, and a memory apparatus 74.

The comparator circuit 71 compares a signal voltage $V_{Out}$ of a column signal line $62_m$ corresponding to pixel signals output from the pixels 40 of a nth column of the pixel array section 51 with a reference signal $V_{Ref}$ of a ramp wave supplied from the reference signal generator 55. Regarding the comparator circuit 71, for example, an output $V_{co}$ becomes a low level when the reference signal $V_{Ref}$ is larger than the signal voltage $V_{Out}$ and the output $V_{co}$ becomes a high level when the reference signal $V_{Ref}$ is equal to or smaller than the signal voltage $V_{Out}$.

The up/down counter 72 is an asynchronous counter. Under the control of a control signal $CS_2$ supplied from the timing control unit 58, the up/down counter 72 is supplied with the clock signal CK from the timing control unit 58 at the same time as the reference signal generator 55 is supplied with it. The up/down counter 72 performs down-counting or up-counting in synchronization with the clock signal CK, to thereby measure a comparison period from the start of the comparison operation to the end of the comparison operation at the comparator circuit 71.

Under the control of a control signal $CS_3$ supplied from the timing control unit 58, the transfer switch 73 is brought into an on (close) state at a point of time when the up/down counter 72 completes the count operation of the pixels 40 of the certain row. The transfer switch 73 transfers the count result of the up/down counter 72 to the memory apparatus 74.

In this manner, with respect to the analog signals supplied from the pixels 40 of the pixel array section 51 through the column signal lines $62_1$ to $62_m$ for each pixel column, the comparison operation is first performed by each of the comparator circuits 71 in the A/D conversion circuits 63 ($63_1$ to $63_m$). Then, in the up/down counter 72, the count operation from the start of the comparison operation to the end of the comparison operation at the comparator circuit 71 is performed. Thus, the analog signal is converted into the digital signal and stored in the memory apparatus 74.

The column scanning unit 56 is constituted of a shift register, an address decoder, and the like and controls column addresses and column scanning of the A/D conversion circuits $63_1$ to $63_m$ in the column processing unit 54. Under the control of the column scanning unit 56, the digital signals A/D-converted by the A/D conversion circuits $63_1$ to $63_m$ are sequentially read out by the horizontal output line 57 and output as imaging data through the horizontal output line 57.

Note that, in the above-mentioned configuration example, the description of the column processing unit 54 has been made exemplifying the configuration in which the A/D conversion circuits 63 is provided having the one-to-one corresponding relationship for each of the column signal lines 62. However, they are not limited to the one-to-one corresponding relationship arrangement. For example, a configuration in which a single A/D conversion circuit 63 is shared with a plurality of pixel columns and used in the plurality of pixel columns in a time division manner can also be employed.

[Pixel Configuration]

Figure 12:
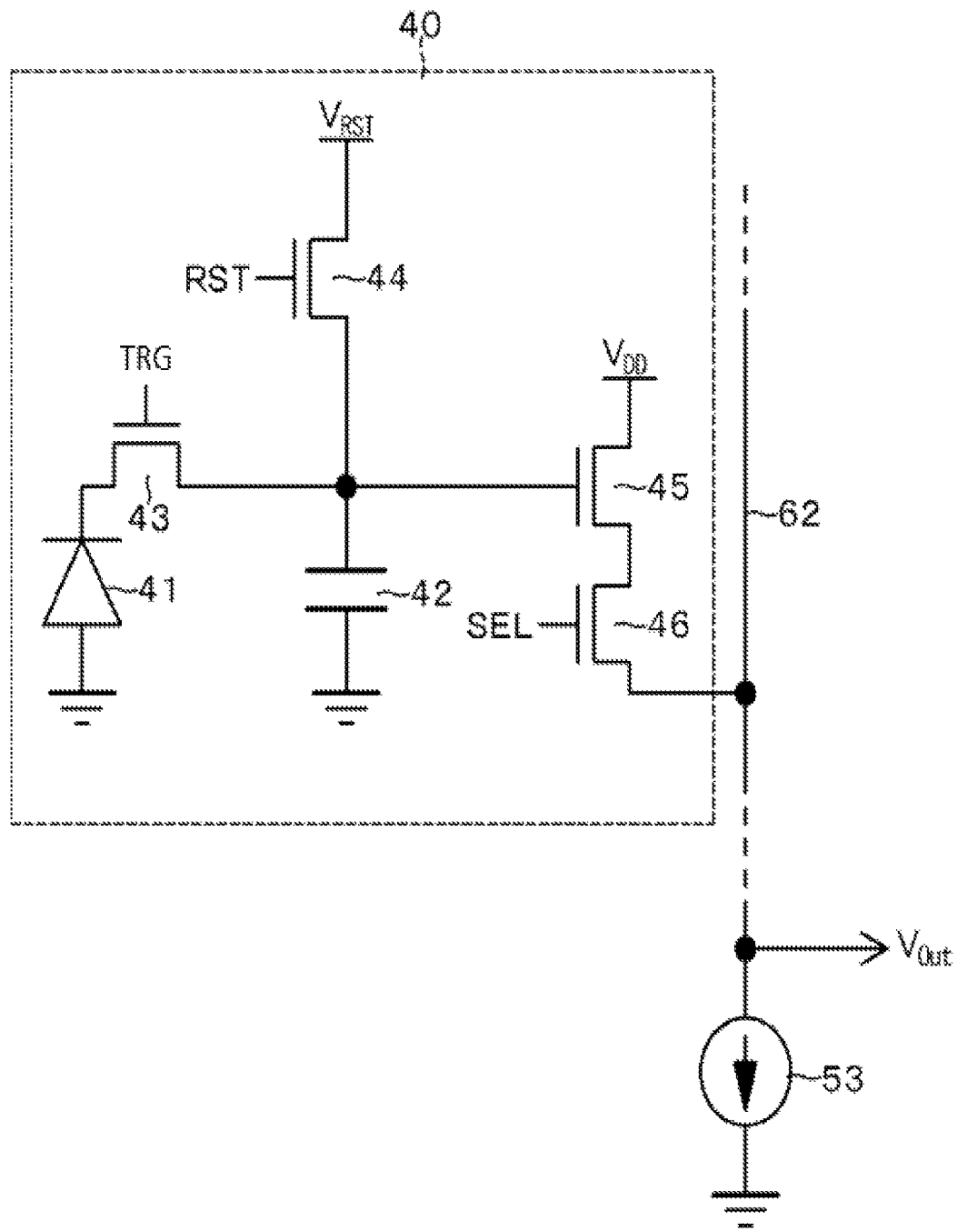
FIG. 12 is a circuit diagram showing an example of a configuration of a pixel.

FIG. 12 shows an example of a configuration of the pixel 40. As shown in FIG. 12, the pixel 40 according to this configuration example includes a photodiode 41 as the photoelectric conversion section, for example. In addition to the photodiode 41, the pixel 40 includes, for example, a charge/voltage conversion section 42, a transfer transistor (transfer gate section) 43, a reset transistor 44, an amplification transistor 45, and a selection transistor 46.

Note that N-channel MOS transistors are used as the transfer transistor 43, the reset transistor 44, the amplification transistor 45, and the selection transistor 46, for example. It should be noted that the illustrated conduction combination of the transfer transistor 43, the reset transistor 44, the amplification transistor 45, and the selection transistor 46 is merely an example and it is not limited to such a combination.

With respect to this pixel 40, as the above-mentioned row control lines 61 ($61_1$ to $61_n$), a plurality of control lines are commonly wired for pixels of the same pixel row. In FIG. 12, for simplification of the figure, the illustration of the plurality of control lines is omitted. The plurality of control lines are connected to output ends of the row scanning unit 52, which correspond to pixel rows in a pixel row unit. The row scanning unit 52 appropriately outputs a transfer signal TRG, a reset signal RST, and a selection signal SEL to the plurality of control lines.

The photodiode 41 includes an anode electrode connected to a negative-side power-supply (e.g., ground) and photo-electrically converts received light into photocharges (here, photoelectrons) having a charge amount corresponding to the amount of light and accumulates the photocharges. A cathode electrode of the photodiode 41 is electrically connected to a gate electrode of the amplification transistor 45 via the transfer transistor 43.

The region electrically connected to the gate electrode of the amplification transistor 45 is the charge/voltage conversion section 42 that converts charges into a voltage. Hereinafter, the charge/voltage conversion section 42 will be referred to as an FD (flowing diffusion region/impurity diffusion region) section 42.

The transfer transistor 43 is connected between the cathode electrode of the photodiode 41 and the FD section 42. A gate electrode of the transfer transistor 43 is supplied from a transfer signal TRG that becomes active at a high level (e.g., $V_{DD}$ level) (hereinafter, referred to as "High-active") from a row scanning unit 13. The transfer transistor 43 is brought into a conduction state in response to the transfer signal TRG and transfers the photocharges photoelectrically converted and accumulated by the photodiode 41 to the FD section 42.

The reset transistor 44 includes a drain electrode connected to a reset power-supply $V_{RST}$ and a source electrode connected to the FD section 42. A gate electrode of the reset transistor 44 is supplied with a High-active reset signal RST from the row scanning unit 52. The reset transistor 44 is brought into a conduction state in response to the reset signal RST and resets the FD section 42 by discarding the charges of the FD section 42 to the reset power-supply $V_{RST}$.

The amplification transistor 45 includes a gate electrode connected to the FD section 42 and a drain electrode connected to a pixel power-supply $V_{DD}$. The amplification transistor 45 serves as an input unit of a source follower that is a read-out circuit that reads out a signal obtained by the photoelectric conversion at the photodiode 41. That is, the amplification transistor 45 includes a source electrode connected to the column signal line 62 via the selection transistor 46, to thereby constitute the source follower together with the current source 53 ($53_1$ to $53_m$) connected to one end of the column signal line 62.

For example, the selection transistor 46 includes a drain electrode connected to a source electrode of the amplification transistor 45 and a source electrode connected to the column signal line 62. The gate electrode of the selection transistor 46 is supplied form a High-active selection signal SEL from the row scanning unit 52. The selection transistor 46 is brought into a conduction state in response to the selection signal SEL. Thus, the pixel 40 is selected and the signal output from the amplification transistor 45 is transmitted to the column signal lines 62.

Note that the selection transistor 46 can also take a circuit configuration in which it is connected between the pixel power-supply $V_{DD}$ and a drain electrode of the amplification transistor 45. Furthermore, the pixel 40 is not limited to one having the above-mentioned 4Tr-pixel configuration. For example, the pixel 40 may be one having a 3Tr-pixel configuration in which the selection transistor 46 is omitted and the amplification transistor 45 is provided with the function of the selection transistor 46.

In the CMOS image sensor of the column parallel A/D conversion system as described above, the comparator circuit 10A according to Embodiment 1 or the comparator circuit 10B according to Embodiment 2 may be used as each of the comparator circuits 71 at the input stage of the A/D conversion circuits 63 ($63_1$ to $63_m$).

In the CMOS image sensor of the column parallel A/D conversion system, if the accuracy error occurs in the comparison operation of the comparator circuit 71 due to the power-supply fluctuation or the like, the imaging data corresponding to the magnitude of the signal voltage $V_{out}$ of the pixel 40 cannot be obtained. As a result, a desired captured image cannot be obtained. However, the comparator circuit 10A according to Embodiment 1 or the comparator circuit 10B according to Embodiment 2 can reduce the influence of the power-supply fluctuation and the like and eliminate the accuracy error of the comparison operation, and hence even if the power-supply fluctuation or the like occurs, the imaging data corresponding to the magnitude of the signal voltage $V_{Sig}$, that is, the desired captured image can be obtained.

Note that, in this embodiment, the comparator circuit 10A according to Embodiment 1 or the comparator circuit 10B according to Embodiment 2 is used as each of the comparator circuits 71 at the input stage of the A/D conversion circuits 63 in the CMOS image sensor of the column parallel A/D conversion system, it is not limited thereto. That is, the comparator circuit 10A according to Embodiment 1 or the comparator circuit 10B according to Embodiment 2 may be used as a comparator circuit at an input stage of a single A/D conversion circuit or may be, in various electronic circuits using the A/D conversion circuit, used as a comparator circuit at an input stage of the A/D conversion circuit.

It should be noted that the present disclosure may also take the following configurations.

[A01]<<Comparator Circuit . . . First Aspect>>

A comparator circuit, including:

a first switch section that selectively takes in a signal voltage;

a second switch section that selectively takes in a control waveform;

a capacity section including one end connected to each of output ends of the first switch section and the second switch section;

a differential amplifier including an inverted input end connected to the other end of the capacity section and a non-inverted input end supplied with a reference voltage; and a third switch section that selectively short-circuits the inverted input end and an output end of the differential amplifier.

[A02] The comparator circuit according to [A01], in which the reference voltage is a fixed voltage.

[A03] The comparator circuit according to [A01] or [A02], in which the control waveform has a voltage variation of sawtooth waveform.

[A04] The comparator circuit according to any one of [A01] to [A03], in which the first switch section and the third switch section are driven by switch control pulses having the same phase, and the second switch section is driven by a switch control pulse having a phase opposite to that of the first switch section and the third switch section.

[A05] The comparator circuit according to any one of [A01] to [A04], further including a current supply section that is connected to the output end of the differential amplifier and supplies a current according to an output of the differential amplifier, in which the reference voltage is supplied independently from a power-supply section and a ground section corresponding to the current supply section.

[B01]<<Comparator Circuit . . . Second Aspect>>

A comparator circuit, including:

a first switch section that selectively takes in a signal voltage;

a second switch section that selectively takes in a control waveform;

a differential amplifier including a non-inverted input end connected to each of output ends of the first switch section and the second switch section;

a capacity section including one end connected to an inverted input end of the differential amplifier and the other end supplied with a reference voltage; and a third switch section that selectively short-circuits the inverted input end and an output end of the differential amplifier.

[B02] The comparator circuit according to [B01], in which the reference voltage is a fixed voltage.

[B03] The comparator circuit according to [B01] or [B02], in which the control waveform has a voltage variation of sawtooth waveform.

[B04] The comparator circuit according to any one of [B01] to [B03], in which the first switch section and the third switch section are driven by switch control pulses having the same phase, and the second switch section is driven by a switch control pulse having a phase opposite to that of the first switch section and the third switch section.

[B05] The comparator circuit according to any one of [B01] to [B04], further including a current supply section that is connected to the output end of the differential amplifier and supplies a current according to an output of the differential amplifier, in which the reference voltage is supplied independently from a power-supply section and a ground section corresponding to the current supply section.

[C01]<<A/D Conversion Circuit . . . Corresponding to Comparator Circuit According to First Aspect>

An A/D conversion circuit, including:

a first switch section that selectively takes in a signal voltage;

a second switch section that selectively takes in a control waveform;

a capacity section including one end connected to each of output ends of the first switch section and the second switch section;

a differential amplifier including an inverted input end connected to the other end of the capacity section and a non-inverted input end supplied with a reference voltage; and a third switch section that selectively short-circuits the inverted input end and an output end of the differential amplifier.

[C02] The A/D conversion circuit according to [C01], in which the reference voltage is a fixed voltage.

[C03] The A/D conversion circuit according to [C01] or [C02], in which the control waveform has a voltage variation of sawtooth waveform.

[C04] The A/D conversion circuit according to any one of [C01] to [C03], in which the first switch section and the third switch section are driven by switch control pulses having the same phase, and the second switch section is driven by a switch control pulse having a phase opposite to that of the first switch section and the third switch section.

[C05] The A/D conversion circuit according to any one of [C01] to [C04], further including a current supply section that is connected to the output end of the differential amplifier and supplies a current according to an output of the differential amplifier, in which the reference voltage is supplied independently from a power-supply section and a ground section corresponding to the current supply section.

[D01]<<A/D Conversion Circuit . . . Corresponding to Comparator Circuit According to Second Aspect>>

An A/D conversion circuit, including:

a first switch section that selectively takes in a signal voltage;

a second switch section that selectively takes in a control waveform;

a differential amplifier including a non-inverted input end connected to each of output ends of the first switch section and the second switch section;

a capacity section including one end connected to an inverted input end of the differential amplifier and the other end supplied with a reference voltage; and a third switch section that selectively short-circuits the inverted input end and an output end of the differential amplifier.

[D02] The A/D conversion circuit according to [D01], in which the reference voltage is a fixed voltage.

[D03] The A/D conversion circuit according to [D01] or [D02], in which the control waveform has a voltage variation of sawtooth waveform.

[D04] The A/D conversion circuit according to any one of [D01] to [D03], in which
the first switch section and the third switch section are driven by switch control pulses having the same phase, and
the second switch section is driven by a switch control pulse having a phase opposite to that of the first switch section and the third switch section.

[D05] The A/D conversion circuit according to any one of [D01] to [D04], further including
a current supply section that is connected to the output end of the differential amplifier and supplies a current according to an output of the differential amplifier,
in which the reference voltage is supplied independently from a power-supply section and a ground section corresponding to the current supply section.

[E01]<<Display Apparatus . . . First Aspect>>
A display apparatus that is configured such that a plurality of pixels each constituted of a light-emitting section and a drive circuit that drives the light-emitting section are arranged in a two-dimensional matrix form, the drive circuit including
a comparator circuit that compares a signal voltage with a control waveform, and
a driving transistor that drives the light-emitting section according to an output of the comparator circuit, the comparator circuit including
a first switch section that selectively takes in a signal voltage,
a second switch section that selectively takes in a control waveform,
a capacity section including one end connected to each of output ends of the first switch section and the second switch section,
a differential amplifier including an inverted input end connected to the other end of the capacity section and a non-inverted input end supplied with a reference voltage, and
a third switch section that selectively short-circuits the inverted input end and an output end of the differential amplifier.

[E02] The display apparatus according to [E01], in which
the plurality of pixels are arranged in a first direction and a second direction in the two-dimensional matrix form and a pixel group is divided into a P-number of pixel blocks along the first direction, and
the light-emitting sections from the light-emitting sections constituting the pixels belonging to a first pixel block to the light-emitting sections constituting the pixels belonging to a Pth pixel block are caused to sequentially emit light for each pixel block at the same time and, when the light-emitting sections constituting pixels of some pixel blocks are caused to emit light, the light-emitting sections constituting the pixels belonging to remaining pixel blocks are prevented from emitting light.

[E03] The display apparatus according to [E01] or [E02],
in which the light-emitting section emits light a plurality of times based on a plurality of control waveforms.

[E04] The display apparatus according to any one of [E01] to [E03],
in which the number of control waveforms supplied to the drive circuit in one display frame is smaller than the number of control waveforms in the one display frame.

[E05] The display apparatus according to any one of [E01] to [E04],
in which the plurality of pixels are formed on a semiconductor.

[E06] The display apparatus according to any one of [E01] to [E05],
in which any one of the pixel blocks always emits light in the one display frame.

[E07] The display apparatus according to any one of [E01] to [E06],
in which the pixel block not emitting light is present in the one display frame.

[E08] The display apparatus according to any one of [E01] to [E07], further including
a control pulse generation circuit that generates a control pulse having a voltage variation of sawtooth waveform.

[E09] The display apparatus according to any one of [E01] to [E08],
in which an absolute value of the voltage of the control pulse increases and then decreases with elapse of time.

[E10] The display apparatus according to [E09],
in which gamma correction is performed based on the voltage of the control pulse that varies with elapse of time.

[E11] The display apparatus according to [E10],
in which an absolute value of a rate of variation of the control pulse with a time being a variable is proportional to a constant of 2.2.

[E12] The display apparatus according to any one of [E01] to [E11],
in which the light-emitting section is constituted of a light-emitting diode.

[E13] The display apparatus according to any one of [E01] to [E12],
in which the reference voltage is a fixed voltage that is not affected by a power-supply fluctuation.

[E14] The display apparatus according to any one of [E01] to [E13],
in which the control waveform has a voltage variation of sawtooth waveform.

[E15] The display apparatus according to any one of [E01] to [E14], in which
the first switch section and the third switch section are driven by switch control pulses having the same phase, and
the second switch section is driven by a switch control pulse having a phase opposite to that of the first switch section and the third switch section.

[E16] The display apparatus according to any one of [E01] to [E15], further including
a current supply section that is connected to the output end of the differential amplifier and supplies a current according to an output of the differential amplifier,
in which the reference voltage is supplied independently from a power-supply section and a ground section corresponding to the current supply section.

[F01]<<Display Apparatus . . . Second Aspect>>
A display apparatus that is configured such that a plurality of pixels each constituted of a light-emitting section and a drive circuit that drives the light-emitting section are arranged in a two-dimensional matrix form, the drive circuit including
a comparator circuit that compares a signal voltage with a control waveform, and
a driving transistor that drives the light-emitting section according to an output of the comparator circuit, the comparator circuit including
a first switch section that selectively takes in a signal voltage,
a second switch section that selectively takes in a control waveform, a differential amplifier including a non-inverted input end connected to each of output ends of the first switch section and the second switch section, a capacity section including one end connected to an inverted input end of the differential amplifier and the other end supplied with a reference voltage, and a third switch section that selectively short-circuits the inverted input end and an output end of the differential amplifier.

[F02] The display apparatus according to [F01], in which the plurality of pixels are arranged in a first direction and a second direction in the two-dimensional matrix form and a pixel group is divided into a P-number of pixel blocks along the first direction, and the light-emitting sections from the light-emitting sections constituting the pixels belonging to a first pixel block to the light-emitting sections constituting the pixels belonging to a Pth pixel block are caused to sequentially emit light for each pixel block at the same time and, when the light-emitting sections constituting pixels of some pixel blocks are caused to emit light, the light-emitting sections constituting the pixels belonging to remaining pixel blocks are prevented from emitting light.

[F03] The display apparatus according to [F01] or [F02], in which the light-emitting section emits light a plurality of times based on a plurality of control waveforms.

[F04] The display apparatus according to any one of [F01] to [F03], in which the number of control waveforms supplied to the drive circuit in one display frame is smaller than the number of control waveforms in the one display frame.

[F05] The display apparatus according to any one of [F01] to [F04], in which the plurality of pixels are formed on a semiconductor.

[F06] The display apparatus according to any one of [F01] to [F05], in which any one of the pixel blocks always emits light in the one display frame.

[F07] The display apparatus according to any one of [F01] to [F06], in which the pixel block not emitting light is present in the one display frame.

[F08] The display apparatus according to any one of [F01] to [F07], further including a control pulse generation circuit that generates a control pulse having a voltage variation of sawtooth waveform.

[F09] The display apparatus according to any one of [F01] to [F08], in which an absolute value of the voltage of the control pulse increases and then decreases with elapse of time.

[F10] The display apparatus according to [F09], in which gamma correction is performed based on the voltage of the control pulse that varies with elapse of time.

[F11] The display apparatus according to [F10], in which an absolute value of a rate of variation of the control pulse with a time being a variable is proportional to a constant of 2.2.

[F12] The display apparatus according to any one of [F01] to [F11], in which the light-emitting section is constituted of a light-emitting diode.

[F13] The display apparatus according to any one of [F01] to [F12], in which the reference voltage is a fixed voltage that is not affected by a power-supply fluctuation.

[F14] The display apparatus according to any one of [F01] to [F13], in which the control waveform has a voltage variation of sawtooth waveform.

[F15] The display apparatus according to any one of [F01] to [F14], in which the first switch section and the third switch section are driven by switch control pulses having the same phase, and the second switch section is driven by a switch control pulse having a phase opposite to that of the first switch section and the third switch section.

[F16] The display apparatus according to any one of [F01] to [F15], further including a current supply section that is connected to the output end of the differential amplifier and supplies a current according to an output of the differential amplifier, in which the reference voltage is supplied independently from a power-supply section and a ground section corresponding to the current supply section.

DESCRIPTION OF SYMBOLS 10A, 10B comparator circuit
11 first switch section
12 second switch section
13 third switch section
14 capacity section
15 differential amplifier
16 fourth switch section
17 fifth switch section
20 pixel
21 light-emitting section
22 drive circuit
23 comparator circuit
24 current source
31 memory
32 controller
33 D/A converter
34 low-pass filter
35 amplifier
36 multiplexer
40 pixel
41 photodiode
42 charge/voltage conversion section
43 transfer transistor (transfer gate section)
44 reset transistor
45 amplification transistor
46 selection transistor
51 pixel array section
52 row scanning unit
53 current source section
54 column processing unit
55 reference signal generator
56 column scanning unit
57 horizontal output line
58 timing control unit
61 ($61_1$ to $61_n$) row control line
62 ($62_1$ to $62_m$) column signal line
63 ($63_1$ to $63_m$) A/D conversion circuit
71 comparator circuit
72 up/down counter
73 transfer switch
74 memory apparatus
101 voltage supply section
102 scanning circuit
103 control waveform generation circuit
104 image signal output circuit IN$_1$, IN$_2$ circuit input terminal
OUT circuit output terminal
Φ$_1$, Φ$_2$ switch control pulse
TR$_{Drv}$ light-emitting section-driving transistor

The invention claimed is:

1. A comparator circuit, comprising:
    a first switch section configured to selectively receive a signal voltage;
    a second switch section configured to selectively receive a control waveform;
    a capacity section including a first end and a second end, wherein the first end is connected to each of an output end of the first switch section and an output end of the second switch section;
    a differential amplifier including an inverted input end and a non-inverted input end configured to receive a reference voltage, wherein the inverted input end is connected to the second end of the capacity section, and wherein the reference voltage is a fixed voltage that is independent of a power-supply fluctuation;
    a third switch section between the inverted input end and an output end of the differential amplifier, wherein the third switch section is configured to selectively short-circuit the inverted input end and the output end of the differential amplifier; and
    a fourth switch section connected between the output end of the differential amplifier and an input end of an inverter.

2. The comparator circuit according to claim 1, wherein the control waveform has a voltage variation of sawtooth waveform.

3. The comparator circuit according to claim 1, wherein
    each of the first switch section and the third switch section is driven by a first switch control pulse, wherein the first switch control pulse has a first phase,
    the second switch section is driven by a second switch control pulse having a second phase, and
    the second phase is opposite to the first phase.

4. The comparator circuit according to claim 3, further comprising
    a current supply section configured to supply a current based on an output of the differential amplifier, wherein the current supply section is connected to the output end of the differential amplifier,
    wherein the reference voltage is independent of a power-supply section and a ground section, and wherein the ground section corresponds to the current supply section.

5. The comparator circuit according to claim 4, wherein the fourth switch section is configured to selectively short-circuit the output end of the differential amplifier and the input end of the inverter, wherein the fourth switch section is driven by the second switch control pulse.

* * * * *